United States Patent [19]

Kaplan

[11] Patent Number: 5,502,648
[45] Date of Patent: Mar. 26, 1996

[54] DATA PROCESSING METHOD OF GENERATING INTEGRATED CIRCUITS USING PRIME IMPLICANTS

[75] Inventor: Jonathan T. Kaplan, New York, N.Y.

[73] Assignee: Massachusetts Institute of Technology, Cambridge, Mass.

[21] Appl. No.: 41,546

[22] Filed: Apr. 2, 1993

Related U.S. Application Data

[63] Continuation-in-part of Ser. No. 510,728, Apr. 18, 1990, Pat. No. 5,237,513, and a continuation-in-part of Ser. No. 439,555, Nov. 20, 1989, abandoned.

[51] Int. Cl.$^6$ .................................................. G06F 17/50
[52] U.S. Cl. ........................... 364/490; 364/489; 364/488
[58] Field of Search ..................................... 364/491, 490, 364/489, 488, 715.01, 784; 326/113, 119

[56] References Cited

U.S. PATENT DOCUMENTS

| | | | |
|---|---|---|---|
| 4,541,067 | 9/1985 | Whitaker | 364/716 |
| 4,622,648 | 11/1986 | Whitaker | 364/715 |

OTHER PUBLICATIONS

W. D. Becher, "Karnaugh Map Minimization," *Logical Design Using Integrated Circuits*, 1977, Hayden Book Co. USA, pp. 93–119.

S. Whitaker, "Pass–Transistor Networks Optimize n–MOS Logic," *Electronics*, pp. 144–148.

R. Brayton et al., "Multiple–Level Logic Optimization System," *IEEE Inter Conf. on CAD*, 1986, pp. 356–359.

M. Y. Tsai, "Pass Transistor Networks in MOS Technology: Synthesis, Performance, and Testing," *Proc. of IEEE Conf.*, 1983, pp. 509–512.

O. Ishizuka, "Synthesis of a Pass Transistor Network Applied to Multi–Valued Logic," *Proc. of the 16th IEEE ISMVL*, 1986, pp. 51–57.

O. Ishizuka and J. Xu, "Simplification of Pass Transistor Networks and its Applications," *Proc. of 17th IEEE ISMVL*, 1987, pp. 292–297.

R. K. Brayton and C. McMullen, "The Decomposition and Factorization of Boolean Expression," *IEEE Symposium on Circuits and Systems*, 1982, pp. 49–54.

E. Detjens et al., "Technology Mapping in MIT," *Proc. of IEEE Int'l conf. on CAD*, 1987, pp. 116–119.

Brayton et al., "MIS: A Multiple–Level Optimization System," *Proc. of Int'l Workshop on Logic Synthesis*, 1987.

*Primary Examiner*—Vincent N. Trans
*Attorney, Agent, or Firm*—Hamilton, Brook, Smith & Reynolds

[57] ABSTRACT

An integrated circuit structure is generated to perform a given combinational function. A data processing system generates the integrated circuit structure when provided with an input specification of the function to be performed by the structure. The resulting integrated circuit structure is comprised of both restoring logic networks and pass logic networks. The integrated circuit structure is generated in three major steps. First, data structures, comprised of multidimensional spaces, are computed to represent the function. Two types of data structures are computed: those which view an input as a pass value and a data structure which views the inputs solely as control variables. In the second major step prime implicants are found within the data structures. Third, from among the prime implicants a certain subset is selected to cover the function most efficiently. The third major step, of selecting a most efficient subset of prime implicants, further comprises three main substeps. First, counting the number of data structure nodes covered by the subset of prime implicants selected. Second, the number of transistors required to implement the subset of prime implicants is calculated. Third, the number of nodes from the first substep is divided by the number of transistors from the second substep to produce an efficiency metric.

26 Claims, 11 Drawing Sheets

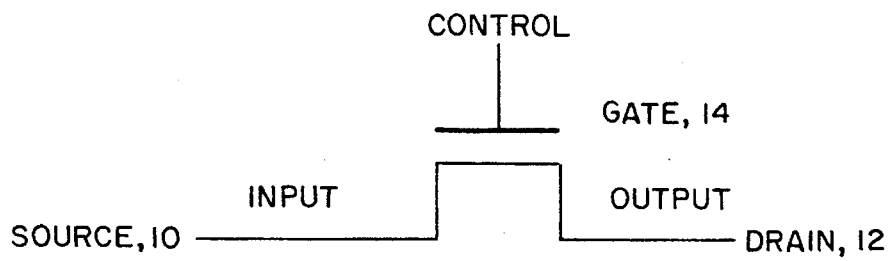
FIG. 1 (PRIOR ART)
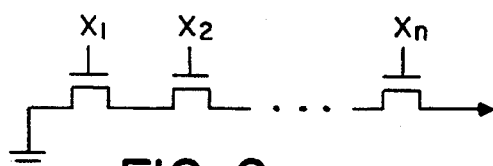
FIG. 2a (PRIOR ART)
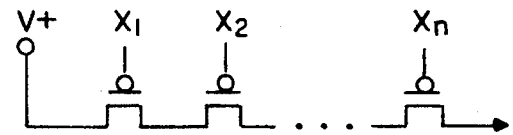
FIG. 2b (PRIOR ART)
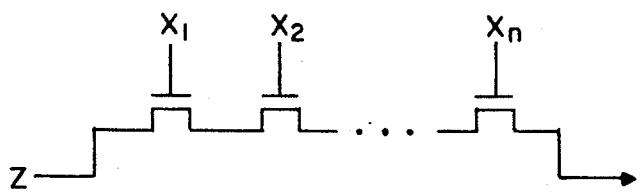
FIG. 2c (PRIOR ART)
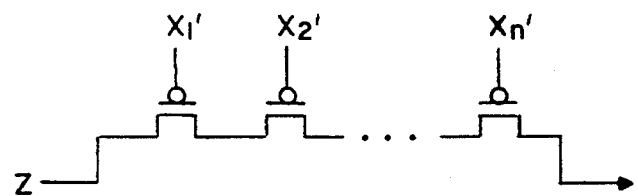
FIG. 2d (PRIOR ART)
Truth Table:
| c | b | a | f |
|---|---|---|---|
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |
FIG. 3a
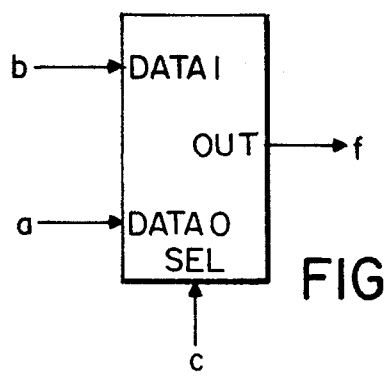
FIG. 3b A prime implicant $X_1 \cdot X_2 \cdot ... X_n$ covering 1's:

NEXPR: $(X_1 \cdot X_2 \cdot ... X_n):(Z)$
PEXPR: $(X_1' \cdot X_2' \cdot ... X_n'):(Z)$ Input Truth Table:

| b | a | f |
|---|---|---|
| 0 | 0 | 0 |
| 0 | 1 | X |
| 1 | 0 | 1 |
| 1 | 1 | X |

Gives 4 Possible Truth Tables:

| b | a | f |
|---|---|---|
| 0 | 0 | 0 |
| 0 | 1 | 0 |
| 1 | 0 | 1 |
| 1 | 1 | 0 |

| b | a | f |
|---|---|---|
| 0 | 0 | 0 |
| 0 | 1 | 1 |
| 1 | 0 | 1 |
| 1 | 1 | 0 |

| b | a | f |
|---|---|---|
| 0 | 0 | 0 |
| 0 | 1 | 0 |
| 1 | 0 | 1 |
| 1 | 1 | 1 |

| b | a | f |
|---|---|---|
| 0 | 0 | 0 |
| 0 | 1 | 1 |
| 1 | 0 | 1 |
| 1 | 1 | 1 |

TRANSFORM1:
$(X \cdot A):(Z)+(X):((Y_1):(Z_1)+(Y_2):(Z_2)+\cdots(Y_n):(Z_n))$
$= (X):((A):(Z)+(Y_1):(Z_1)+(Y_2):(Z_2)+\cdots(Y_n):(Z_n))$ TRANSFORM2:
$(X_1):(Z)+(X_2):(Z)+\cdots(X_n):(Z) = (X_1+X_2+\cdots X_n):(Z)$ RULE 8: STEER_VAR → bool_expr For N network:

STEER_VAR →

For P network:

STEER_VAR →

RULE 6: bool_expr * bool_expr → bool_expr

→

RULE 5: bool_expr + bool_expr → bool_expr

→

RULE 4: (bool_expr):(PASS_VAR → pass_expr

RULE 3: (bool_expr):(pass_expr) → pass_expr

RULE 2: pass_expr + pass_expr → pass_expr

5,502,648

DATA PROCESSING METHOD OF GENERATING INTEGRATED CIRCUITS USING PRIME IMPLICANTS

RELATED PATENT APPLICATIONS

The present application is a Continuation-In-Part of U.S. patent application entitled "Data Processing Method of Generating Integrated Circuits Using Prime Implicants", Ser. No. 07/510,728, filed Apr. 18, 1990, now U.S. Pat. No. 5,237,513 which is a Continuation-In-Part of U.S. patent application Ser. No. 07/439,555, by Jonathan T. Kaplan, filed Nov. 20, 1989, now abandoned.

BACKGROUND OF THE INVENTION

In very large scale integration (VLSI) design, Boolean logic expressions are realized through networks of combinational logic gates. The combinational logic gates come in many varieties including pass logic transistor networks and restoring logic transistor networks. The pass and restoring transistor networks of the combinational logic gates are typically realized as metal on semiconductor field effect transistors (MOSFET).

A schematic of a MOSFET is depicted in FIG. 1. The MOSFET has a source 10, a drain 12 and a gate 14. The gate 14 is coupled to a control signal that dictates whether the input signal passes from the source 10 through the gate 14 to the drain 12 as output. In particular, if the control signal places the gate 14 in a high-impedance state, the input signal does not pass through the gate 14. On the other hand, if the control signal places the gate 14 in a conductive state, the input signal from the source 10 is conducted and passes as an output signal to the drain 12. When employed in this manner, the MOSFET acts as a simple switch.

The MOSFET may be either an N or P type MOSFET. In an N type MOSFET, the substrate is comprised of a P-semiconductor material. When the N type MOSFET conducts, the current carries electrons. With a P type MOSFET, in contrast, the substrate is comprised of N-semiconductor material, and as a result, the current carries holes rather than electrons. A plurality of N MOSFETs coupled together, constitute an N network. Similarly, a plurality of P MOSFETs coupled together form P networks.

Pass logic networks and restoring logic networks may be comprised of both P networks and N networks. The distinction between pass logic networks and restoring logic networks lies in how the networks employ the inputs of the networks combinational logic function. Restoring logic networks employ the inputs to control the gates 14 of the MOSFET's. The source 10 of the MOSFET is tied either high or low, and it is one of these fixed values which is passed from the source 10 to the drain 12 of a MOSFET. This fixed value is passed when the signal applied to the gate 14 puts the transistor in a conducting state. Pass logic networks, however, employ the inputs differently. They employ the inputs as both signals that control the gate 14, and values that are passed from the source 10 to the drain 12.

Example restoring logic networks are shown in FIGS. 2a and 2b. In particular, FIG. 2a shows an N restoring logic network that is tied to a ground (low). The combinational inputs for this network are $X_1, \ldots, X_n$. FIG. 2b shows a similar restoring logic network, but this network is a P restoring network which is tied to a voltage source (high). The combinational inputs $X_1, \ldots, X_n$ are applied as control signals in this network.

FIGS. 2c and 2d depict pass logic networks for a given combinational input Z. In FIG. 2c, an N pass network is shown. FIG. 2d shows a P pass network. Note that all of the control signals are complemented in the P pass network. In both of these pass networks the combinational input Z may assume a value of either 1 or 0.

VLSI designers often desire to use both pass logic networks and restoring logic networks in designing integrated circuits. Currently, however, automated generation of combinational logic has focused exclusively on integrated circuits having only restoring logic networks. As such, if a designer desires to use pass logic networks in his integrated circuit design, he cannot utilize an automated generation approach. This is especially problematic given the significant advantages of including pass logic networks in integrated circuit designs. For instance, pass logic networks (often) generate smaller (and/or faster) integrated circuits. Smaller integrated circuits are cheaper to produce while faster integrated circuits yield higher performance products.

SUMMARY OF THE INVENTION

The present invention concerns an integrated circuit structure that is comprised of pass and restoring logic networks. A data processor is programmed to generate this structure so that it performs a specified function. The integrated circuit structure produced by the data processor is preferably a complimentary metal oxide semiconductor (CMOS) structure. The pass and restoring logic networks of the structure may comprise complimentary N and P transistor networks having multiple inputs.

The data processor that generates this integrated circuit structure is comprised of an input means for receiving a specification of the function to be performed by the integrated circuit. It also includes a processor for receiving the input function and for generating a schematic description of the circuit appropriate to perform that function. This circuit is (as described above) comprised of both pass logic networks and restoring logic networks. Lastly, an output means is provided in the data processor to output the schematic description of the circuit generated by the processor. The processor is preferably comprised of a plurality of parallel processing units so as to optimize the speed with which complex integrated circuit structures are generated.

The system operates in stepwise fashion. The first step of operation is inputting the function to be performed by the integrated circuit. The function that is input may be input in a variety of different ways, but it is preferred that the function be input as a characterization of the inputs and corresponding outputs of the function such as a truth table. Once the function has been input, data structures are generated. The data structures are comprised of multi-dimensional spaces that represent the inputs and outputs of the function. A representation of the inputs and outputs is stored within these data structures. There are data structures that view the inputs as pass variables as well as data structures that view the inputs as control variables.

Once the data structures have been generated and the representations have been stored in the data structures, prime implicants are found for the representations. These prime implicants are then examined, and certain ones of the prime implicants are selected to generate the integrated circuit structure. In accordance with one embodiment, the prime implicants are selected by first determining which prime implicants when added to a set of already selected prime implicants create a most efficient partial cover. Initially, this partial cover is empty. Once a prime implicant has been found that creates a most efficient partial cover, the prime implicant is added to the existing partial cover to generate a new partial cover. These steps are repeated until the updated partial cover covers the function. Efficiency is preferably determined by examining the number of vertices covered by a partial cover and dividing that amount by the number of transistors required to implement the partial cover. It is also preferred that if more than one prime implicant generates equally efficient new partial covers that the system operate recursively on each of the new partial covers to find an ultimately most efficient new partial cover. Once the appropriate set of prime implicants are selected, the schematic description of the integrated circuit is generated in a straightforward fashion.

The data structure that views inputs of the function as control variables is comprised of a plurality of nodes. Each of these nodes has coordinates corresponding to values of inputs of the function. Moreover, each said node has a value equal to an output of the function when the values of the inputs are applied to the function.

Another data structure holds a representation of the function wherein an input is viewed as a pass variable. There is one such data structure for each input. For each such data structure, there are a plurality of nodes. The coordinates for the nodes correspond to values of inputs of the function as they do in the other data structures. The values, however, are different from the previously described variety of data structures. If a node of the data structure has a value of one, it implies that the output of the function is equal to the value of the single input which is viewed as a pass variable. In contrast, if the node has a value of zero, it implies that the output of the function is not equal to the value of the single input which is viewed as a pass variable. Considered collectively, the data structure that views the inputs of the function as control variables, and the data structures that view the inputs of the function as pass variables constitute an optimization space in which the optimal subset of prime implicants which completely cover the function is found.

In addition to the data structures, the present invention relies on an expression format for symbolically representing a combinational logic network. This expression format is first comprised of a boolean expression field. This field expresses the control variables which control output of the pass variable. The expression also includes a pass variable field denoting a value that is allowed to pass as output if the boolean expression has a value of one. In contrast, if the boolean expression has a value of zero, the value is not allowed to pass as output. A delimiter separates the boolean expression field from the pass variable field. In the preferred embodiment, the delimiter comprises a colon.

The present invention has the capability of handling "don't care" conditions. In particular, it has the ability of handling a combination of inputs that will never be applied to the integrated circuit structure (i.e. N type "don't care" conditions). Such input combinations are flagged when the representation of the function is stored in the data structures. Later when the prime implicants of the representation are found, the outputs of these flagged combinations are considered as both ones and zeros. Moreover, when the set of prime implicants are selected the nodes flagged as "don't care" nodes do not need to be covered in order for the selected set of prime implicants to constitute a complete cover.

The present invention can also accommodate "don't care" conditions wherein the inputs may assume a value of either zero or one (i.e. X type "don't care" conditions). Given i nodes of exhibiting X type "don't care" conditions in the input truth table $2^i$ truth tables are generated in which all possible combinations of assignments of 1 and 0 values to the X type nodes are represented. Each of the $2^i$ truth tables is then separately run through the mixed gate generation algorithm. The truth table which produces the cheapest mixed gate (i.e., a gate that combines pass and restoring transistor networks) is taken as the solution for the original truth table which contains X nodes.

The above description is presented in application Ser. No. 07/510,728. In summary, that application describes a method for producing, automatically, optimal transistor networks which combine pass and restoring logic. The method begins with a functional description of the circuit to be implemented and outputs a schematic description of the transistor network implementing the function.

The three major steps of the method are as follows. First, data structures, comprised of multidimensional spaces, are computed to represent the function. Two types of data structures are computed: those which view an input as a pass variable and a data structure which views the inputs solely as control variables. In the second major step prime implicants are found within the data structures. Third, from among the prime implicants a certain subset is selected to cover the function most efficiently.

The third step, of selecting a most efficient subset of prime implicants, further comprises three main substeps. First, counting the number of data structure nodes covered by the subset of prime implicants selected. Second, the number of transistors required to implement the subset of prime implicants is calculated. Third, the number of nodes from the first substep is divided by the number of transistors from the second substep to produce an efficiency metric.

The second substep, determining the number of transistors required to implement a subset of prime implicants, is a difficult task. The prior application presents a Transform1 and a Transform2 for minimizing the pass expression which represents the subset of prime implicants. The application also presents a method for using these transforms, in combination with boolean minimization, to achieve a minimized pass expression.

The application of Transform2 is relatively straightforward. Transform2 is used to collect boolean expressions, driven by functionally identical pass expressions, enabling greater boolean minimization.

The application of Transform1 is much more complex. The operation of Transform1 is to replace redundant pass paths with shared pass circuitry in a pass expression. The operation of Transform1 will be defined below in the Detailed Description. Any operation of Transform1 upon a given pass expression shall be called a merge.

Although identifying an opportunity for a merge in a pass expression is straightforward, systematically determining the optimal merges to perform is difficult. Determining the optimal set of merges to perform on a given pass expression is often necessary to determine the most optimal implementation of a function.

The present invention further comprises a set of methods which allow the optimal set of merges to be determined automatically.

A method is presented for determining the set of all possible merges on a given pass expression and this set shall be called allMerges.

A method is presented for determining whether a set of merges can be performed concurrently on a pass expression.

A set of merges which can be performed concurrently is called a concurrMergeSet.

A method is presented for finding a concurrMergeSet such that there is no other merge, not already in the concurrMergeSet but in allMerges, which can be performed concurrently with the concurrMergeSet. This type of concurrMergeSet is called a maxMergeSet.

A method is presented for finding all the maxMergeSet's of a given pass expression.

BRIEF DESCRIPTION OF THE DRAWINGS

FIG. 1 depicts a schematic of a MOSFET.

FIGS. 2a and 2b depict restoring logic networks.

FIGS. 2c and 2d depict pass logic networks.

FIG. 3a depicts the truth table for the 2MUX function.

FIG. 3b depicts the logic symbol for the 2MUX function.

DETAILED DESCRIPTION OF THE PREFERRED EMBODIMENT

Figure 4A:
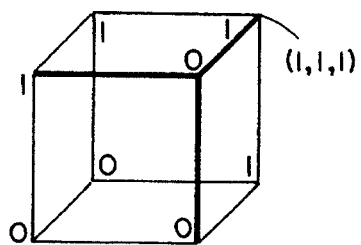
FIGS. 4a, 4b, 4c and 4d depict the 3-spaces of the optimization space for the 2MUX function.

The present invention broadens the class of integrated circuits that can be designed algorithmically. In particular, it expands the class of circuits which can be designed algorithmically to include gates that utilize both pass logic networks and restoring logic networks. By combining both of these types of networks, the present invention vastly expands the range of integrated circuit designs available to a designer. Since the process is performed algorithmically, the designer can work with a higher level description than if he were forced to proceed manually. As a result, the designer need not become unnecessarily involved with trivial details of the design rather, he can focus on the important higher level issues. The present invention, hence, provides an approach that is less complex to the designer, and accordingly, less prone to design error.

The system operates by receiving as input a specification of the function to be performed by the integrated circuit structure. The function may be input into the data processing system in a variety of different formats. In the preferred format, the function is input as a truth table. A truth table lists the inputs of the function and the corresponding outputs of the function produced in response to the inputs. An example truth table for a 2MUX function is shown in FIG. 3a. A logical symbolic representation of this function is shown in FIG. 3b. In general, for the 2MUX function the input "c" acts as a select to select either the input "a" or the input "b".

It should be appreciated, however, that the scope of the present invention is not limited to inputting the description of the function as a truth table. An equally viable alternative is for the function to be specified as a karnaugh map (K-map) or to be specified in another alternative format. In general, what is required is a representation of the function in terms of its inputs and outputs. Once such a description of the function is provided to the data processing system, programs held within the system analyze the description and produce an integrated circuit structure design that performs the function.

The first step in analyzing the input is to map the function into an optimization space. The optimization space is a plurality of boolean N-spaces which are represented as data structures within the system. The boolean N-spaces are N dimensional spaces having a plurality of vertices (sometimes referred to as nodes). The system is able to generate an optimal plurality of pass logic networks and restoring logic networks from the optimization space. The optimization space is comprised of N+1 boolean N-spaces for an N-input function. Thus, if there are three inputs, such as in the 2MUX function, the N-spaces are three dimensional spaces. From the above statement, it also follows that if there are three inputs to the functions, then, there are four boolean three spaces for that function. Amongst these N+1 boolean N-spaces, one of the N-spaces views the inputs as control signals for a restoring logic network. This N space is utilized by the system to generate the restoring logic networks. The remaining N-spaces view the inputs as pass values. A separate N-space is created for each input. These N-spaces are utilized to generate the pass logic networks.

For purposes of distinguishing the one N space that views the inputs as control signals from the other N-spaces, the one N-space that views the inputs as control signals is referred to as the CONSTANT space. It is referred to as the CONSTANT space because it represents restoring logic networks that pass only constant values of either one or zero. The other remaining N-spaces are referred to by the particular input variable which they view as a pass value. For the 2MUX example, the boolean N-space that views the input variable "a" as a pass value (shown in FIG. 4b) is denoted as the a-space.

As mentioned above, all of these spaces are N-dimensional boolean spaces. For a function F having inputs $A_1, A_2, \ldots, A_n$, a dimension is assigned to each of the n inputs (note that n=N). As also mentioned previously, the boolean N-spaces are comprised of a plurality of vertices or nodes. Each vertex in the N-space is referenced by its coordinates. The coordinates for any vertex are the corresponding inputs for that vertex. As such, each set of inputs written as $(A_1, A_2, \ldots, A_n)$ becomes the address of a unique vertex in a boolean N-space.

FIGS. 4a, 4b, 4c and 4d illustrate sample boolean 3-spaces for the 2MUX function (see the truth table in FIG. 3a). In particular, FIG. 4a shows the boolean 3-space that comprises the CONSTANT 3-space for the 2MUX function. The value of each of the vertices in this space is the output produced for the combination of inputs that are the coordinates of that vertex. For instance, the output produced when all of the inputs are one also has a value of one. This vertex is denoted in FIG. 4a by its coordinates (1, 1, 1) (where the vectors are ordered as (c, b, a) to follow the truth table for the 2MUX function in FIG. 3a). The value can be checked by referring to the last line of the truth table depicted in FIG. 3a, which indicates that if all the inputs are one, the output of the function is, likewise, one.

Figure 4C:
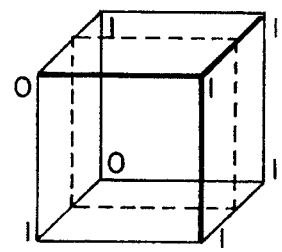
Figure 4B:
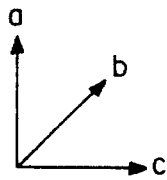
Figure 4B:
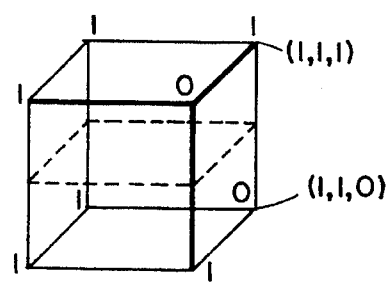
Figure 4D:
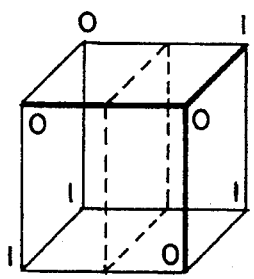
Figure 5A:
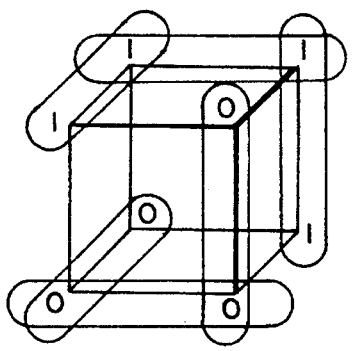
FIGS. 5a, 5b, 5c and 5d depict the prime implicants of the 3-spaces for the 2MUX function.
Figure 5C:
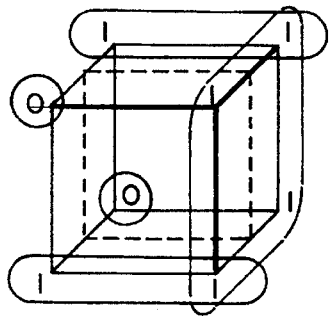
Figure 5B:
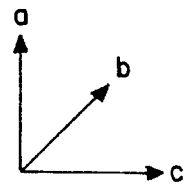
Figure 5B:
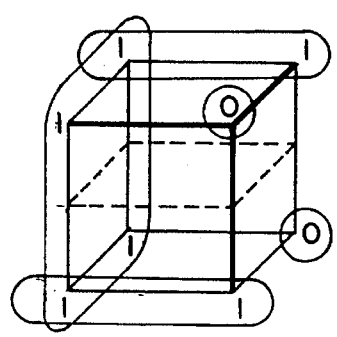
Figure 5D:
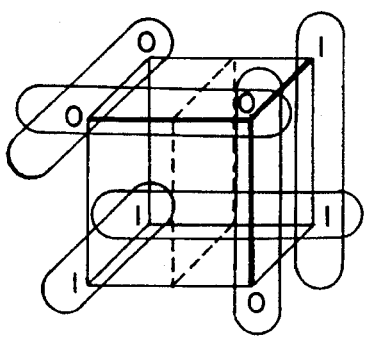

The remaining 3-spaces depicted in FIGS. 4b, 4c and 4d are the 3-spaces that consider the inputs as pass values. FIG. 4b depicts input "a" as a pass value, FIG. 4c depicts input "b" as a pass value and lastly, FIG. 4d depicts input "c" as a pass value. Each of these figures includes a plane that is shown in phantom form. This phantom plane serves as a dividing boundary between the two possible values that the pass value input may assume. For example, in FIG. 4b the phantom plane divides the possible values of input "a" which may be either zero or one. Similarly, in FIGS. 4c and 4d the phantom planes divide the values of input "b" and input "c", respectively.

The values at the vertices in the 3-spaces of FIGS. 4b, 4c and 4d are determined by whether the value of the input viewed as a pass value or the compliment of the value of the input has to be passed to produce the appropriate output. If the value of the input has to be passed, then a one is put as the value of the vertex. In contrast, if the value of the compliment of the input has to be passed, a zero is put as the value of the vertex. To aid in clarifying this point, it is helpful to refer to the truth table depicted in FIG. 3a. The vertex at (1, 1, 1) in FIG. 4b has a value of one. By referring to the truth table in FIG. 3a, it can be seen that the output produced for these inputs is one (as discussed above with respect to the CONSTANT space). Hence, the value of input "a" has to be passed to produce the corresponding output and therefore, a value of one is at that vertex. On the other hand, if one examines the value at vertex (1, 1, 0) as shown in FIG. 4b, a value of zero is found. The value is zero for this vertex because the compliment of input "a", as opposed to the noncomplimented value of input "a", has to be passed to produce the proper output.

There are several motivations for the creation of these multiple data structures that represent the function as boolean N-spaces. A primary motivation is that this representation proves especially useful in reducing the function (e.g. the 2MUX function) to an optimal form. Moreover, this representation is convenient for generating the two distinct types of logic networks used by the present invention.

Once the boolean N-spaces are constructed, the prime implicants are found for the boolean N-spaces using the Quine-McCluskey method. The Quine-McCluskey method is well known in the prior art and is described, for instance, in W. D. Becher, *Logical Design Using Integrated Circuits*, 1977. The Quine-McCluskey algorithm is utilized separately for each of the N-spaces to produce a set of prime implicants for each N-space. FIGS. 5a, 5b, 5c, and 5d show the prime implicants for the 2MUX function as derived using the Quine-McCluskey algorithm.

The Quine-McCluskey (QM) algorithm is an orderly way of producing the prime implicants. It initially begins with each individual node in a boolean N-space being an implicant. The QM algorithm then "grows" the prime implicants by the operations of consensus and subsumption, where consensus refers to the operation by which two small implicants are merged to create a larger single implicant. Once a larger implicant is created by consensus, the algorithm checks to see if the new implicant subsumes, or contains, any other implicants. When the QM algorithm stops, the algorithm has found a set of largest implicants which are not contained, or redundant, with respect to each other. These largest implicants are the prime implicants.

There is one twist in the approach adopted by the present invention that differs from a straightforward application of the Quine-McCluskey approach. In the present approach, redundant prime implicants are removed in finding the set of prime implicants for each N-space. Specifically, prime implicants in the N-spaces that view inputs as pass values are examined to determine whether they span both of the values that the pass variable may assume. If the prime implicants do not span both of the variable's values, they are redundant and are covered by other prime implicants.

Figure 6C:
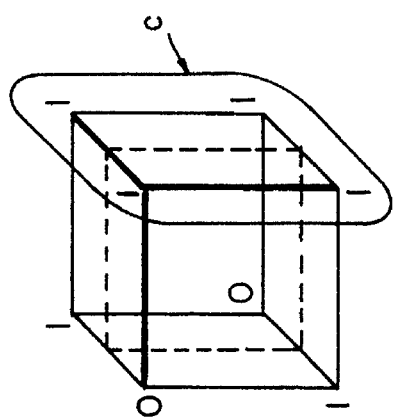
FIGS. 6a, 6b, 6c and 6d depict the non-redundant prime implicants of the 3-spaces of the 2MUX function.
Figure 6D:
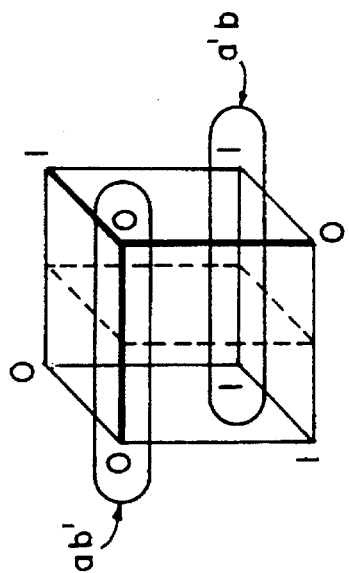
Figure 6A:
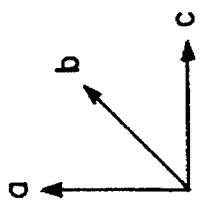
Figure 6A:
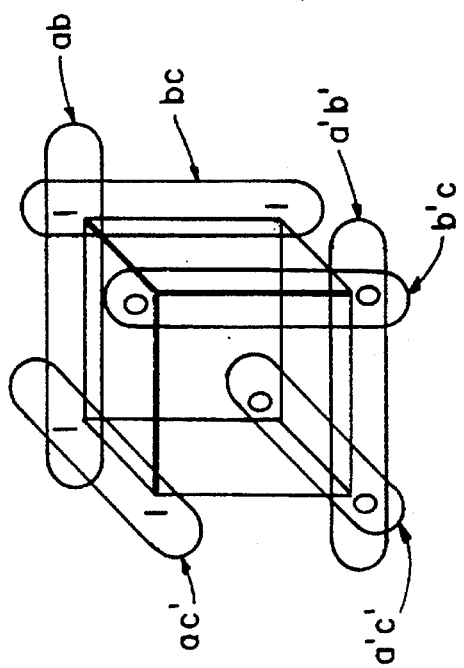
Figure 6B:
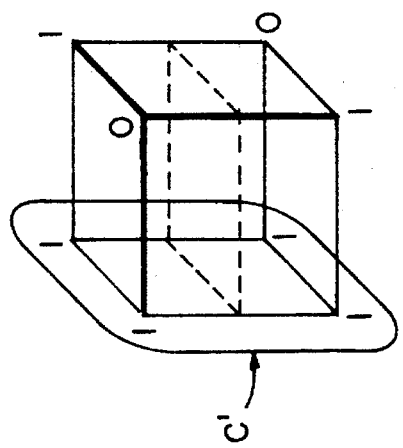

FIGS. 5a, 5b, 5c and 5d provide a good illustration of the redundancy of prime implicants in the three N-spaces that view inputs as pass values. For instance, in FIG. 5b all of the prime implicants that do not span the plane shown in phantom form are redundant to prime implicants of the CONSTANT space depicted in FIG. 5a. Similarly, there are redundant prime implicants in FIG. 5c and 5d. FIGS. 6a, 6b, 6c and 6d show the prime implicants that remain after the redundant prime implicants are struck. These prime implicants are labelled with their corresponding boolean expressions. As can be seen in FIG. 6b, the sole remaining prime implicant is labelled "c". The system represents the prime implicants utilizing symbolic notations referred to as pass expressions. Table I depicts the grammar utilized for pass expressions. As depicted in Table I, a pass expression may comprise a disjunction of two or more different pass expressions. It may also comprise a boolean expression separated by a colon from another pass expression. The colon acts as a delimiter between the two parts of the expression. In particular, the colon separates the right-hand side of the expression which constitutes the value to be passed from the left-hand side of the expression which determines whether the value will be passed. A pass expression may also take the form of a boolean expression separated by a colon from a pass variable as opposed to being separated from another pass expression. The colon, however, still retains the same significance. As shown at the bottom of Table I, a pass variable is an element of a set comprised of the inputs of the function unioned with the compliment of the inputs further unioned with the value of one or zero (depending on whether the pass expression is an N or P type pass expression). The utility of utilizing this type of notation is that it helps gather the control signals together in a single boolean expression so that they can be optimized.

Figure 13:
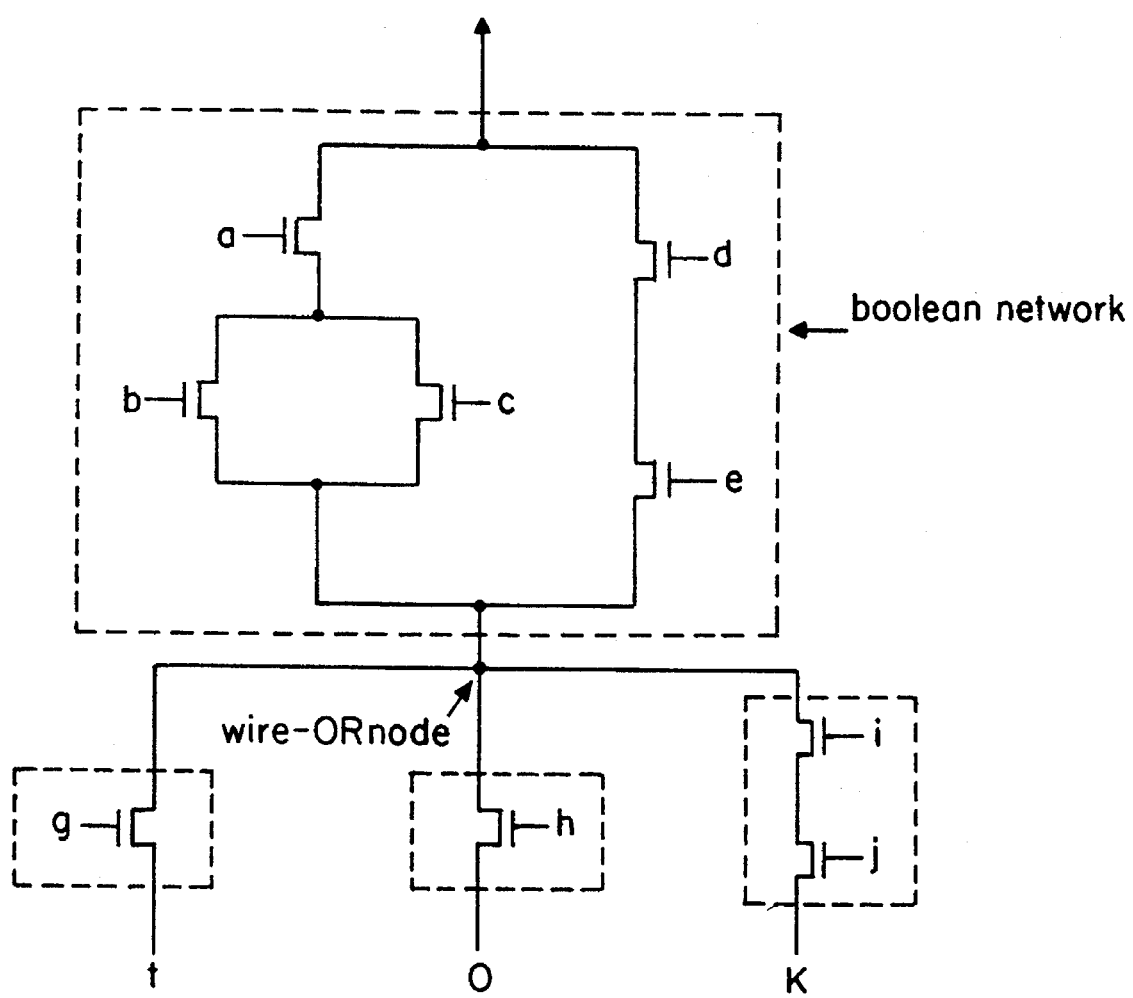
FIG. 13 shows an example pass expression and the N network corresponding with the example pass expression.

The semantics of the grammar of Table I, in terms of transistor networks is defined in FIGS. 12a–12f. Further, an example pass expression and the N transistor network to which it parses is shown in FIG. 13.

TABLE I

| 1. | Start→pass_expr |
| 2. | pass_expr→pass_expr + pass_expr |
| 3. | \| (bool_expr):(pass_expr) |
| 4. | \| (bool_expr):(PASS_VAR) |
| 5. | bool_expr→bool_expr + bool expr |
| 6. | \| bool_expr * bool_expr |
| 7. | \| (bool_expr) |
| 8. | \| STEER_VAR |

The pass expression for a function $f(a_1, a_2, ... a_n)$ has:

INPUTS={ $a_1, a_2, ... a_n$ }

INV_INPUTS={ $a'_1, a'_2, ... a'_n$ }

STEER_VAR $\in$ INPUTS $\cup$ INV_INPUTS

For N pass expression:
PASS_VAR $\in$ INPUTS $\cup$ INV_INPUTS $\cup$ {0}

For P pass expression:
PASS_VAR $\in$ INPUTS $\cup$ INV_INPUTS $\cup$ {1}

The pass expressions for the prime implicants depicted in FIGS. 6a, 6b, 6c and 6d for the 2MUX function are shown in FIGS. 7a, 7b, 7c and 7d, respectively. All of the pass expressions are expressed in the format of a boolean equation separated by a colon from either a CONSTANT value or an input value that is a pass variable. These expressions are examples of pass expressions taken from the grammar shown in Table I. For instance, in FIG. 7a, the prime implicant that spans the vertices at (1,1,0) and (1,1,1) is represented as a pass expression (b'c'):(1). This implies that a value of a one will be passed when both "b" and "c" are one.

Figure 7C:
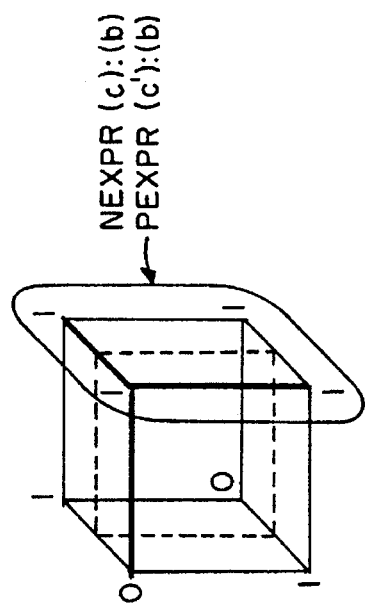
FIGS. 7a, 7b, 7c and 7d depict the pass expressions for the prime implicants of the 2MUX function.
Figure 7D:
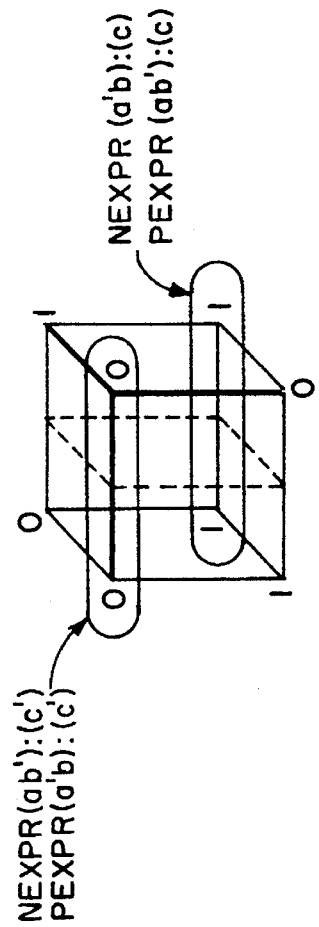
Figure 7A:
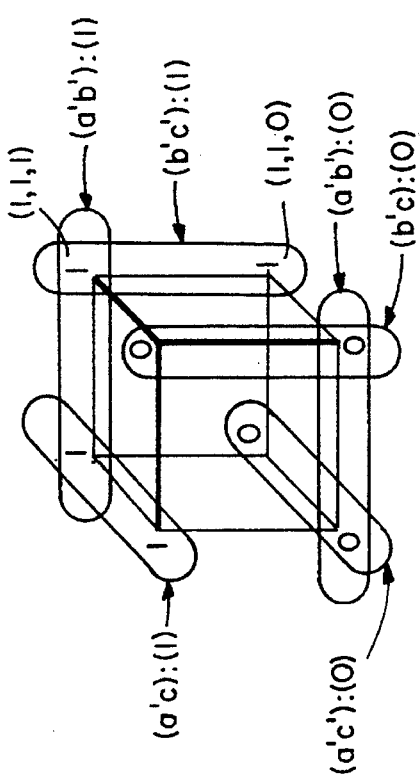
Figure 7B:
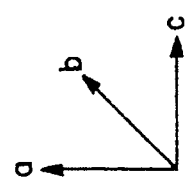
Figure 7B:
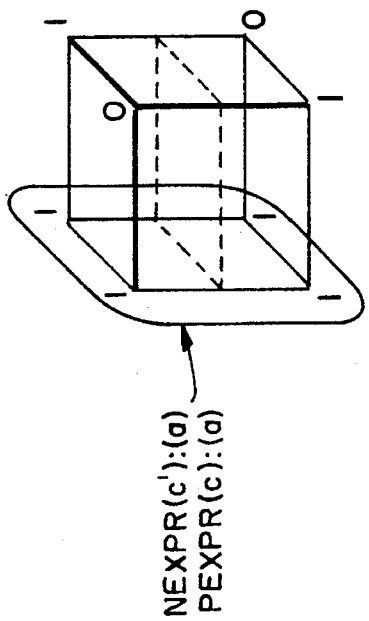

It should be noted that for each prime implicant shown in the 3-spaces of FIGS. 7b, 7c and 7d there is both an N pass expression and a P pass expression. These pass expressions are referred to as NEXPR and PEXPR, respectively, in those figures. Separate N and P pass expressions are required for these boolean 3-spaces because the pass variable (e.g. "a" for the prime implicant shown in FIG. 7b) may assume a value of either one or zero.

Having determined the prime implicants and the pass expressions for the prime implicants, the system then directs its attention to finding an optimal combination of these prime implicants that can be used to form the integrated circuit structure. The system utilizes two primary data structures to assist it in its task of finding the optimal set of prime implicants. The first of these data structures is created for each prime implicant. This data structure is referred to as PRIME. It has several fields including the NEXPR field which contains the pass expression for the N logic network of the prime implicant. Conversely, PRIME also includes the field PEXPR which contains the pass expression for the P logic network of the prime implicant. Additionally, a field denoted as COV is provided in PRIME. COV is a vector describing nodes that are covered by the prime implicant. The resulting set of PRIME data structures for the 2MUX function is shown in Table II.

TABLE II

| PRIME.NEXPR | PRIME.PEXPR | PRIME.COV |
|---|---|---|
|  | (a'c):(1) | [01010000] |
|  | (a'b'):(1) | [00010001] |
|  | (b'c'):(1) | [00000011] |
| (a'c'):(0) |  | [10100000] |
| (a'b'):(0) |  | [10001000] |
| (b'c):(o) |  | [00001100] |
| (c'):(a) | (c):(a) | [11110000] |
| (c):(b) | (c'):(b) | [00001111] |
| (ab'):(c') | (a'b):(c') | [01000100] |
| (a'b):(c) | (ab'):(c) | [00100010] |

The second data structure denoted as COVER is utilized in generating a cover of the function that the integrated circuit structure performs. In general, COVER contains a list of all prime implicants that have been added to the cover. COVER, like the PRIME data structure, has several fields which are NPRIMES, PPRIMES, NFACT, PFACT and COV. The NPRIMES field contains all of the NEXPR expressions that have been added to the cover. Likewise, PPRIMES contains all the PEXPR expressions that have been added to the cover. Two other fields, NFACT and PFACT, are used to hold, in minimized factored form, the N pass expressions and P pass expressions added to COVER. Lastly, a field denoted as COV is included. It comprises a vector describing the nodes that are covered by the prime implicants held in COVER.

The present invention selects a subset of the prime implicants that completely covers the function with minimal cost. As mentioned previously, it does this with the assistance of the above described data structures. A complete cover of the function is achieved when the PRIME implicants added to COVER include vertices for every combination of inputs which requires an output. Any effort to guarantee that a complete cover of the function is of minimal cost poses a non-polynomial time problem. As a result, the present system adopts a greedy heuristic.

The greedy algorithm seeks to build an optimal cover from the prime implicants that have been previously found using the Quine-McCluskey algorithm. The goal of the selection procedure described here is to select a subset of the prime implicants which completely covers the function. A set of prime implicants completely covers the function when it generates the correct output value for every combination of inputs which are applied to it. A set of prime implicants which does not generate the correct output value for every combination of inputs is called a partial cover. The selection procedure described herein begins with a partial cover which contains no prime implicants. One at a time, every prime implicant which is not already in the partial cover is added to the partial cover. Since the selection procedure begins with an empty partial cover, initially the selection algorithm generates a separate partial cover for every prime implicant which contains only the given prime implicant. Each of these single prime implicant partial covers is rated by efficiency, and the most efficient partial cover is selected. Note, however, that there may be more than one most efficient partial cover. For each most efficient partial cover the selection procedure recurses. The selection procedure recurses by applying the same selection procedure described above for the initially empty partial cover. Every branch of the recursive search is explored until multiple complete covers of the function are produced. The complete cover which is most efficient is used to implement the function as a circuit. If there is more than one most efficient complete cover, then any one of these most efficient solutions may be used to implement the function.

Figures 8, 11:
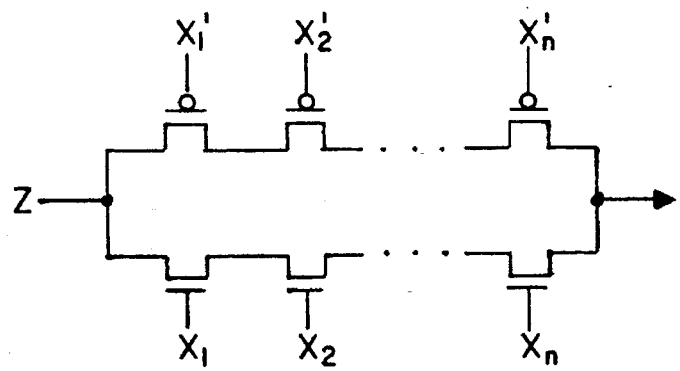
FIG. 8 depicts an exemplary pass logic network.
FIG. 11 depicts an example of the truth tables analyzed for X don't care conditions.

How the pass expressions are implemented in hardware is depicted in FIG. 8 for a pass logic network. In particular, if the N expression and P expression for the prime implicant are as denoted at the bottom of FIG. 8, a transistor network is implemented as a complimentary N transistor network and P transistor network as shown in FIG. 8. Specifically, input Z acts as a pass variable. The remaining X and X' variables act as control signals that determine whether the value of Z is passed to the output or not. To implement an N pass expression, a network similar to the bottom half of the network shown in FIG. 8 is used. Similarly, if a P pass expression is to be constructed, a format similar to the upper half of the network of FIG. 8 is used. The prime implicants taken from the CONSTANT space are implemented in a much more straightforward manner. The prime implicants having a pass expression that passes a zero are like those shown in FIG. 2a, and the prime implicants having pass expressions that pass one have transistor networks like that shown in FIG. 2b.

The major procedures utilized to generate the cover are listed in C-like code in attached Appendix A. The main procedure is called "greedy-select". "greedy-select" utilizes two other major procedures: one procedure (referred to as "combine") combines a remaining prime implicant with the existing partial cover to produce a new partial cover and another procedure (called "get_tran_count") generates the transistor count for this new partial cover. Of particular interest is the "combine" procedure that adds a prime implicant to the partial cover. This procedure operates in three main steps. In the first step, "combine" checks to see if the prime implicant is contained in the partial cover. It also checks to see if the partial cover is contained in the prime implicant. If either are contained within the other, the prime implicant is redundant and, thus, the next prime implicant is examined.

In the second step, "combine" checks to see whether the prime implicant adds in both its N network and its P network to the cover. If the prime implicant is in the CONSTANT space, it contains only either a P network or an N network. On the other hand, if the prime implicant is from a pass variable N-space, the steps for this determination are more complex. For those instances, if the prime implicant adds at least one zero polarity vertex (i.e. the prime implicant includes a vertex that has a value of zero in the CONSTANT space), the N network of the prime implicant must be added. Similarly, if the prime implicant adds at least a single one polarity vertex (i.e. the prime implicant includes a vertex that has a value of one), the prime implicant must be added to the P network. These prime implicants are added utilizing the data structures previously described. For instance, if the prime implicant is added to the N network, then NEXPR is added to the NPRIMES list. Analogously, if a prime implicant is added to the P network, the PEXPR of the prime implicant is added to the cover's PPRIMES list.

Figure 9A:
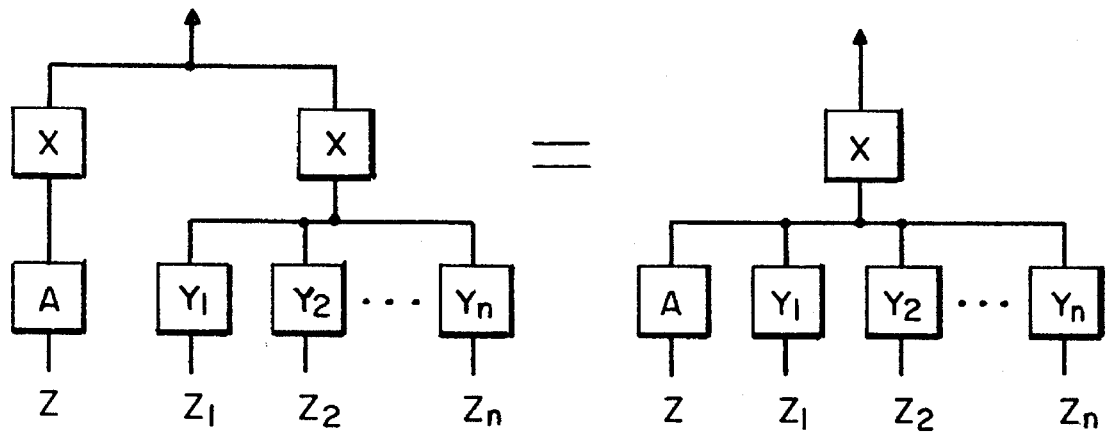
FIG. 9a and 9b depict examples of the transforms performed by the greedy prime implicant selection algorithm.

Once the second step is completed, a multi-level logic minimization of the pass expressions in COVER's NPRIMES AND PPRIMES lists is performed. Two transformations are used in minimizing the pass expressions. These transformations are depicted graphically with example cases in FIGS. 9a and 9b. The general strategy for employing these transformations is shown in the flowchart of FIG. 10. In accordance with this strategy, the process begins with a set of prime implicants that are either all from COVER.NPRIMES or all from COVER.PPRIMES (Box 30). The first step utilized to perform the minimization is to perform transform2 first (Box 32). Transform2 combines into a single boolean expression all of the boolean expressions of all pass expressions that share the same pass value.

Figure 9B:
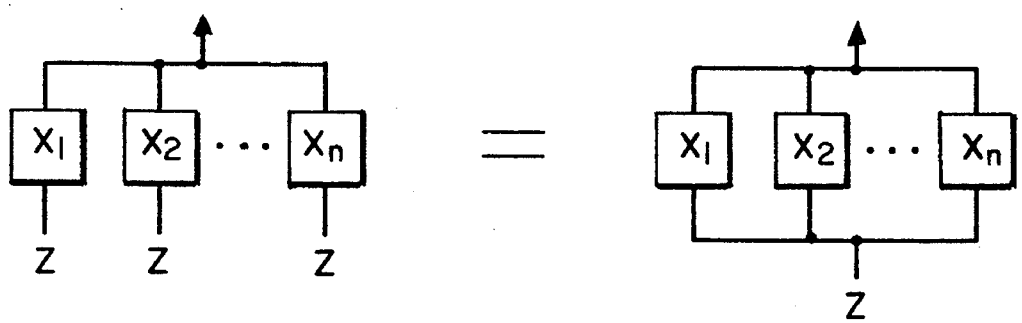
Figure 10:
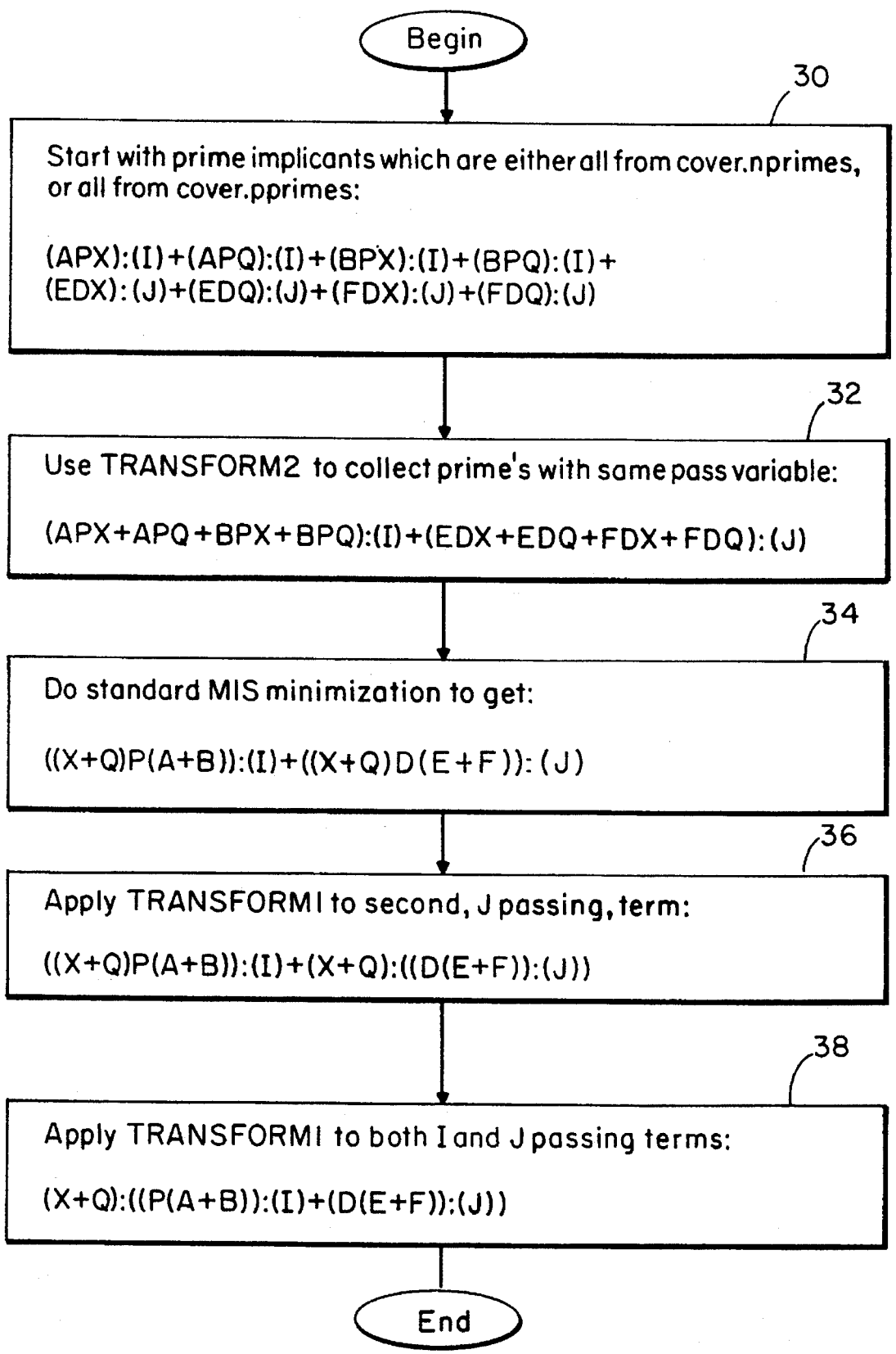
FIG. 10 depicts a flow chart of how the transforms are applied in the greedy selection algorithm.
Figure 12A:
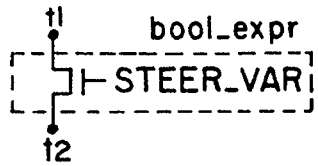
FIGS. 12a–12f illustrate how the grammar translates a pass expression into a circuit.
Figure 12A:
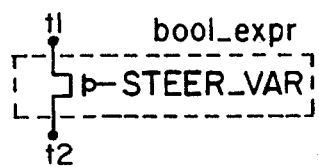
Figure 12B:
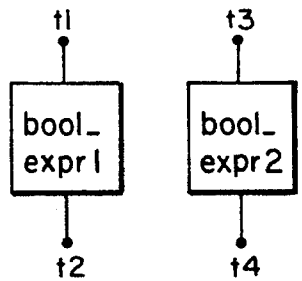
Figure 12B:
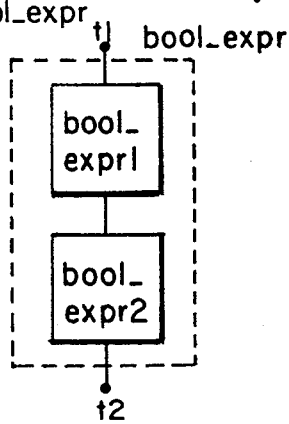
Figure 12C:
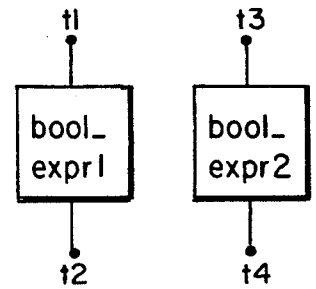
Figure 12C:
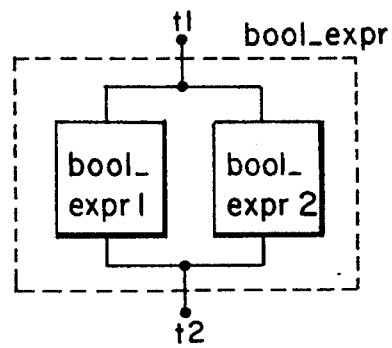
Figure 12D:
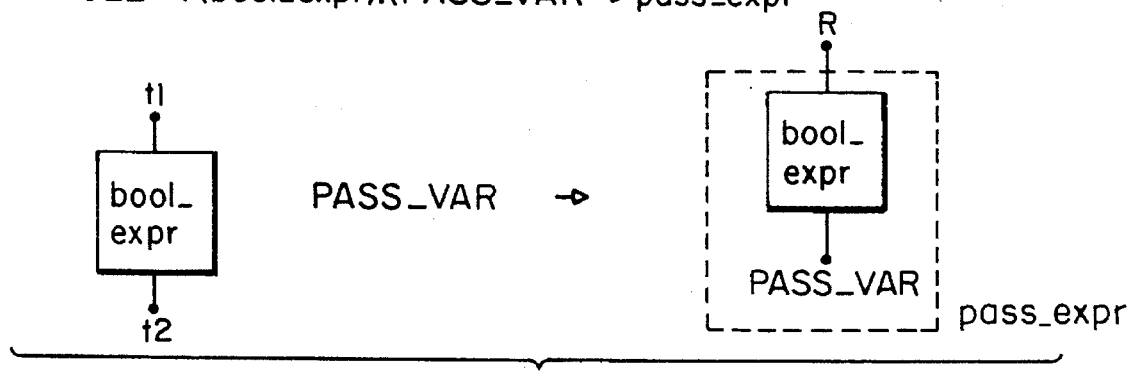
Figure 12E:
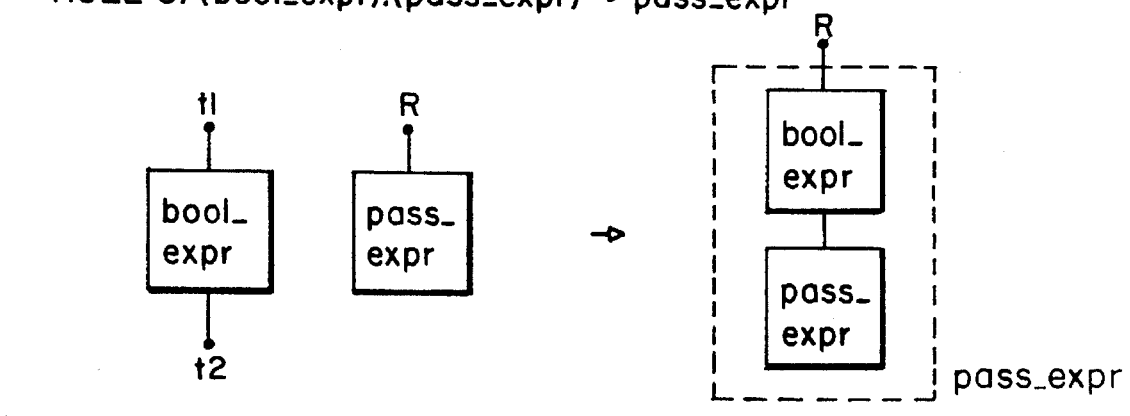
Figure 12F:
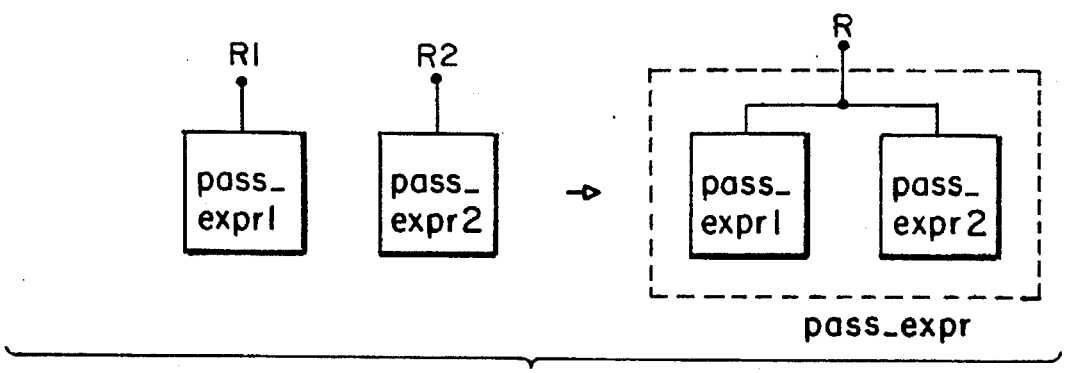

The operation of transform2 is illustrated in FIG. 9b. Once transform2 has been performed, standard multi-level logic minimization, as described in *Design Systems for VLSI Circuits*, edited by G. DeMicheli, A. Sangiovanni-Vincentelli and P. Antognetti by Martinns Nijhoff Publishers (1987) 197–248, is performed (Box 34). Next, transform1 is applied (Boxes 36 and 38) to introduce more wired OR nodes below the pass network's root. Thus, as shown in the example of FIG. 9a, X becomes the root of the pass network with a wired OR to A, $Y_1$, $Y_1$, and $Y_n$.

The other major procedure utilized in finding the best partial cover (i.e. "get_tran_count") is one that determines the number of transistors needed to implement the pass expressions of a cover. This procedure like "combine" operates in three steps. First, it counts the number of transistors in the N and P steering networks. "get_tran_count" does this by counting up the total number of literals appearing in every boolean expression in the N expressions and P expressions which were factorized by "Combine" and are in COVER's NFACT and PFACT. Second, it counts the number of inverters needed to produce the inverted control signals (i.e. inverted control variables). This procedure makes the assumption that one inverter can provide an inverted signal to as many transistors as necessary. Third, the number of "half inverters" is counted. An inverter is considered as two independent N and P halves when the inverter is only supplying an inverted pass variable, and not a control signal to a gate. When an inverter is used only to drive a pass variable, the drains of the inverter's N and P transistors need not be connected together. The N transistor of the inverter only drives the NFACT network, while the P transistor only drives the PFACT network. Notice, for example, that if the PRIME which uses the half inverters adds only to the COVER's PPRIMES list, only a single P transistor is needed to provide the inverted pass variable. This is why the number of N "half inverters" is counted separately from the number of P "half inverters".

The major code sections required to implement the present system are shown in Appendix A. The detailed specifics of the code are left to this appendix. It should be appreciated, however, by those skilled in the art that many alternative implementations of the code sections are possible. The present invention is intended to embody all such alternative implementations.

A unique feature of the present invention that has not been discussed thus far is its ability to handle "don't care" conditions. There are two types of "don't care" conditions that are readily handled by the present invention. The first type is referred to as an N type "don't care" condition. This type of "don't care" condition specifies a combination of inputs which will never be applied to the circuit for the environment in which it is put to use. The second type of "don't care" condition is referred to as an X type "don't care" condition. It specifies a combination of inputs under which the function's output can be either a one or a zero.

For the present invention to properly handle N type don't care conditions, several changes are necessary. Specifically, the mapping of the truth table to the optimization space is changed to incorporate a combination of which is specified as N. In other words, the corresponding vertices in the CONSTANT space and in each of the pass variable spaces are set to N. An additional change concerns finding the prime implicants. In finding the prime implicants, an N node is used as follows. First, all the N nodes in each of the spaces are set to 1. Then all the prime implicants covering 1's in each of the spaces are found. Second, all the N nodes in each of the spaces are set to 0. Then all the prime implicants covering 0's in each of the spaces are found. Since an N represents a combination which will never be applied it is allowed to assume a value that could potentially cause a short circuit.

As can be seen in Appendix B, only a single line of code in the initialization of the global variables is changed in order to process the N nodes. The "empty_cover.cov" vector is initialized to 1 for each N node. By initializing all the N nodes as covered, the greedy selection algorithm thinks it has covered all the nodes as soon as it has picked just enough prime implicants to cover all the non-N nodes.

A number of changes are also required in order to implement the X type "don't care" conditions. Given i nodes of type X in the input truth table, $2^i$ truth tables are generated in which all possible combinations of assignments of 1 and 0 values to the X nodes are represented. For an example, see FIG. 11. Each of the $2^i$ truth tables in FIG. 11 is separately run through the mixed gate generation algorithm. The truth table which produces the cheapest mixed gate is taken as the solution for the original truth table which contains X nodes.

A description of the methods presented here beyond those of application Ser. No. 07/510,728 will be facilitated by the definition of several key terms. In defining these terms it will often be helpful to refer to the pass expression grammar presented in Table I.

The pass expression which Transform1 operates upon shall be called inputPE. A top-level AND operator is an AND operator whose output is the output of a given boolean expression. In terms of Table I, a boolean expression has a top-level AND operator if the reduction (of a boolean operator) closest to the root in the boolean expression's parse tree is Rule 6. Let us call each boolean expression which is the operand of a top-level AND operator an ANDexpr.

In order for Transform1 to be applied, inputPE must be comprised as follows.

The output of inputPE must be driven by an OR operator and the operands of this OR operator are called sub-pass expressions. There must be two or more sub-pass expressions. Another way of describing this requirement is to use the grammar rules of Table I presented above. In the parse tree for inputPE the rule to be applied between the root of the parse tree and the roots of each sub-parse tree (for each of the sub-pass expressions) must be Rule 2.

Each of the sub-pass expressions must be comprised of two sections: a boolean expression which shall be called subBE, and a pass expression which shall be called subPE. In terms of Table I, this requirement means that each sub-pass expression must have as its parse tree root reduction rule either Rule 3 or Rule 4.

For every sub-pass expression at least one of the following two conditions must be met. The first condition, which shall be called Condition1, is that the sub-pass expression's subBE have a top-level AND operator. The second condition, which shall be called Condition2, is that the subPE of the sub-pass expression be more complex than a single pass variable. Condition2 can also be stated in terms of Table I. Condition2 means that the root reduction rule of the sub-pass expression's parse tree must not be Rule 4.

Transform1 can create shared pass paths or merges among the subBE's of the sub-pass expressions in the three following ways.

The first type of sharing is among sub-pass expressions which all satisfy at least Condition1. Transform1 can cause the ANDexpr's of different subBE's, where such ANDexpr's are functionally identical, to be shared.

The second type of sharing is among sub-pass expressions which all satisfy at least Condition2. Transform1 can cause entire subBE's which are functionally identical to be shared.

The third type of sharing is between the following two groups. The first group consists of functionally identical ANDexpr's as was defined for the first type of sharing. The second group consists of functionally identical entire subBE's as was defined for the second type of sharing. Transform1 can cause the ANDexpr's of the first group to be shared with (functionally identical) entire subBE's of the second group.

Figure 14:
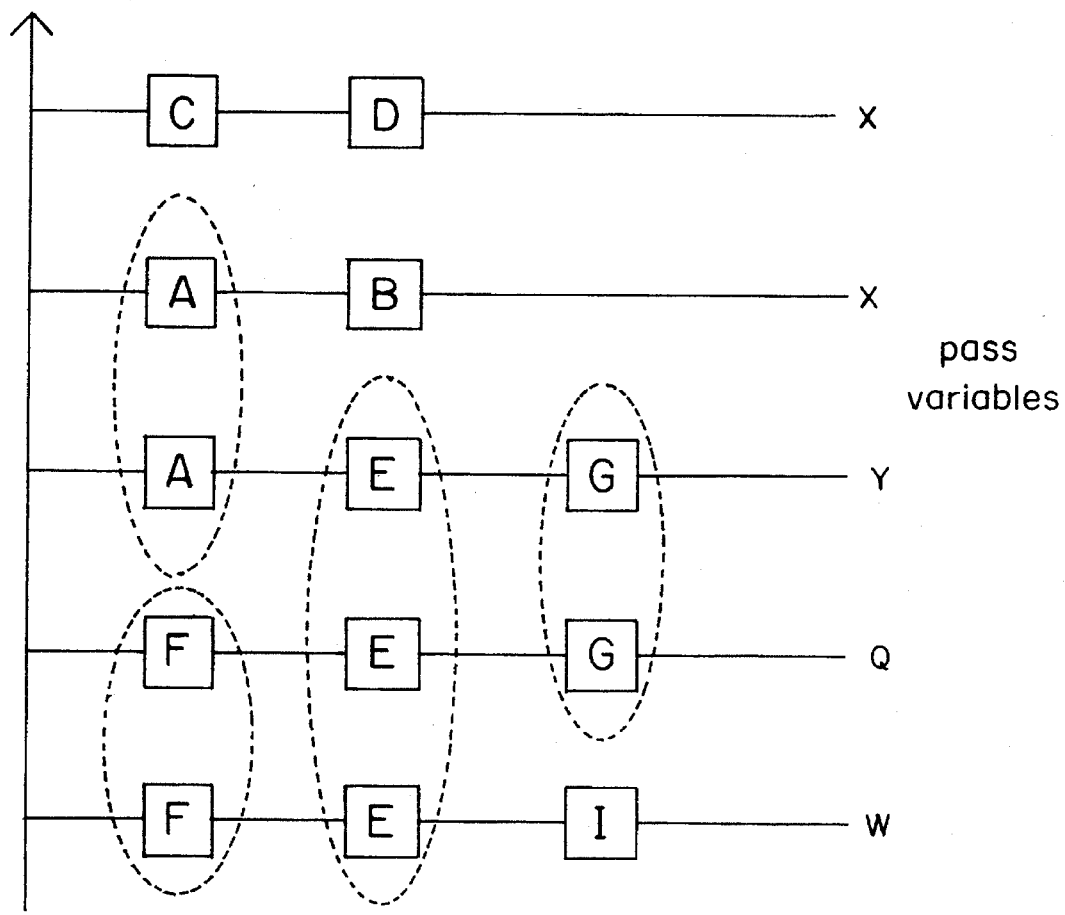
FIG. 14 is an example pass network used to illustrate the methods of this application.

In understanding the following description of the method for finding allMerges it will be helpful to refer to the specific example of Appendix C which follows the steps described below. A schematic diagram of the example inputPE of Appendix C is shown in FIG. 14. Please note that the 13 squares, with the 8 different labels of "A" through "G" and "I", of FIG. 14 are intended to represent only 8 unique topologies of boolean transistor networks. Each label stands for a unique boolean network topology. Thus two squares with the same label both contain transistor networks of the same topology. The transistor networks may be all N transistors or all P transistors. The eight unique boolean expressions, corresponding to the eight unique transistor network topologies represented by labels "A" through "G" and "I", are either a single literal or have a top-level OR operator. A top-level OR operator is an OR operator whose output is the output of a given boolean expression. In terms of Table I, a boolean expression has a top-level OR operator if the reduction (of a boolean operator) closest to the root in the boolean expression's parse tree is Rule 5.

The method for finding the set of all the possible merges, called allMerges, on an inputPE is as follows. I will precede each step of the method for finding allMerges with a number as it is presented.

1) The first step of the method is to convert the pass expression into a form comprised, as described above, so that Transform1 may be applied. Description of this step will be aided by the introduction of the following definition.

Let us call each boolean expression which is the operand of a top-level OR operator an ORexpr.

Sub-pass expressions that do not satisfy either Condition1 or Condition2 cannot be merged. However, if the subBE of an unmergeable sub-pass expression has a top-level OR operator then the sub-pass expression may be made mergeable using Transform2 as follows. If the subBE has n ORexpr's then the sub-pass expression is replaced by n new sub-pass expressions. Each of these new sub-pass expressions has one of the ORexpr's as its subBE and has a copy of the old sub-pass expression's subPE as its subPE.

2) The next step of allMerges is to assign a unique identifier, such as a unique integer, to each subBE of the inputPE.

3) Create a list called mergeableExprs defined as follows. Begin with the mergeableExprs as an empty list. For each subBE with a top-level AND add the subBE's ANDexpr's to mergeableExprs if the ANDexpr is not already in mergeableExprs. If the subBE has no top-level AND then put the entire subBE on mergeableExprs if the subBE is not already in mergeableExprs.

4) For each expression in mergeableExprs create a set, called allTopLevel, containing the unique identifier of each subBE in which the expression from mergeableExprs appears. Note that FIG. 14 has allTopLevel sets with more than one element circled.

5) For each allTopLevel generate all of its subsets (including the entire set allTopLevel) and call this set of all subsets allTopLevels.

6) Eliminate any subsets in allTopLevels with only one element.

The set which describes a single application of Transform1 to inputPE, called a mergeSet, has the following two elements. The first element is an expression, call it expr1, from mergeableExprs and the second element is a subset taken from the allTopLevels set for expr1.

7) Every possible mergeSet, which is allMerges, is created as follows. For every expression from mergeableExprs all of its mergeSet's are created. All the mergeSet's for an expression from mergeableExprs, call it expr1, is created as follows. A mergeSet is created for each of the subsets from the allTopLevels set for expr1. Each of the mergeSet's consists of, as was described above, the two elements expr1 and a subset from expr1's allTopLevels set.

The definition for a concurrMergeSet, which was presented above, can now be restated as follows. A concurrMergeSet is a set of mergeSet's from allMerges where all the mergeSet's can be concurrently performed on the inputPE. A method for finding a concurrMergeSet is as follows.

First, the method for determining whether two mergeSet's can be performed concurrently on the inputPE is presented. The ability to concurrently perform two mergeSet's is determined by comparing the second elements of the two mergeSet's. Let us call the second elements of the two mergeSet's set1 and set2. If any one of the four following tests is satisfied, then the two mergeSet's can be performed concurrently: set1 and set2 are disjoint, set1 and set2 are identical, set1 is a subset of set2, set1 is a superset of set2. These four tests for disjointness, identity, subsetness or supersetness are abbreviated with the term DISS. Thus if set1 is DISS with respect to set2 then the mergeSet's to which set1 and set2 belong can be performed concurrently.

Appendix D illustrates mergeSet's, taken from the allMerges computed in Appendix C, which are and are not DISS with respect to each other.

A set of mergeSet's, call it maybeConcurr, is a concurrMergeSet if the second element of each mergeSet in maybeConcurr is DISS with respect to the second element of every other mergeSet in maybeConcurr.

A concurrMergeSet can be created with the following method. Start with an empty concurrMergeSet. Select any mergeSet from allMerges and put it in the concurrMergeSet. Then select another mergeSet from allMerges and put it in the concurrMergeSet if it is DISS with respect to the mergeSet already in the concurrMergeSet. Continue selecting mergeSet's from allMerges, each time including the mergeSet in the concurrMergeSet if the selected mergeSet is DISS with respect to every mergeSet already in the concurrMergeSet.

The definition of maxMergeSet, which was defined above, can now be restated as follows. A maxMergeSet is a concurrMergeSet where there is no other mergeSet, in allMerges and not in the concurrMergeSet, which can be concurrently performed on inputPE.

The method for finding a maxMergeSet is the same as that described above for finding a concurrMergeSet except that the method continues, adding mergeSet's to the concurrMergeSet, until no more mergeSet's can be added to the concurrMergeSet.

A method for finding all the maxMergeSet's in allMerges is shown in the computer program notation of Appendix E. The program notation is based upon the C programming language.

The method is an exhaustive approach which recursively builds a concurrMergeSet from every mergeSet in allMerges until the method determines a maxMergeSet has been found by not being able to add more mergeSet's to a concurrMergeSet.

A simulation of the computer program of Appendix E, applied to the allMerges computed in Appendix C, is shown in Appendix F.

Combination of the above described methods with Transform2 and boolean minimization is straightforward.

The application Ser. No. 07/510,728 described the following method for use of the transforms and boolean minimization. First, Transform2 is used to combine the boolean expressions for the prime implicants of the inputPE which are driven by the same pass variable. Second, boolean minimization is performed on all the boolean expressions of the inputPE. Finally, Transform1 is applied to minimize the inputPE. It is in this last stage of applying Transform1 where the methods of this current application are applied.

The application of the methods of the current application to the method of application Ser. No. 07/510,728 can be stated in more detail as follows.

The transforms and boolean minimization are used in the "combine" procedure as follows. After the application of Transform2, boolean minimization is performed on prime implicants of new_cover.nprimes and the prime implicants of new_cover.pprimes. The maxMergeSets method is then applied twice since there are two inputPE's: the N transistor inputPE of new_cover.nprimes and the P transistor inputPE of new_cover.pprimes. We shall let maxSetN be the name of the set of maxMergeSet's generated for new_cover.nprimes, and we shall let maxSetP be the name of the set of maxMergeSet's generated for new_cover.pprimes. The maxMergeSet of maxSetN, call it maxN, which reduces literal count the most in the boolean minimized new_cover.nprimes is selected. The maxMergeSet of maxSetP, call it maxP, which reduces literal count the most in the boolean minimized new_cover.pprimes is selected. Then maxN is applied to the new_cover.nprimes and a reduced pass expression is generated which becomes the value of new_cover.nfact. Likewise maxP is applied to the new_cover.pprimes and a reduced pass expression is generated which becomes the value of new_cover.pfact. The minimized pass expressions of new_cover.nfact and new_cover.pfact later have their transistor count counted when get_tran_count is called by greedy_select.

The above method, which performs boolean minimization first and merges second, can be reversed to produce the following method. First, Transform1 is applied to minimize the inputPE. Second, Transform2 is used to combine the boolean expressions of the inputPE which are driven by functionally identical pass expressions. Finally, boolean minimization is performed on all the boolean expressions of the inputPE.

A third variation from the prior method is to alternate partial application of both boolean minimization and Transform1. This would proceed in two steps. First, certain parts of the inputPE would first be boolean minimized while other parts would first have Transform1 applied. Second, the parts that had been boolean minimized would have Transform1 applied to them, and the parts that had Transform1 applied to them would now be boolean minimized.

While the invention has been particularly shown and described with reference to preferred embodiments thereof, it will be understood by those skilled in the art that various changes in form and details may be made without departing from the spirit and scope of the invention as defined in the following claims.

APPENDIX A

```
/* declare global variables */
best_transistor_count, num_nodes_to_cover of type integer;
best_covers of type list;
empty_cover of type COVER;

/* initialize variables */
best_transistor_count = ∞;
best_covers = ();/* best_covers will contain all equally
                    efficient */
                 /* mixed gates to implement function */
num_nodes_to_cover = total number of input combinations to
                    cover,
                    which is 2ⁿ for an n input function;
empty_cover.nprimes = ();
empty_cover.pprimes = ();
empty_cover.cov = a vector of 2ⁿ zeros;

/* call greedy cover selector */
greedy_select (empty_cover);

greedy_select (cover)
    cover of type COVER;
{
    /* declare local variables */
    best_efficiency, trans_count, efficiency of type
                    integer;
    best_partial_covers of type list; prime of type PRIME;
    partial_cover, partial of type COVER;

/* initialize variables */
    best_partial_covers = ();  /* list of most efficient
                    partial*/
                 /* covers to recurse on */
    best_efficiency = 0;

/* loop over all PI's not already in cover */
    For each prime whose prime.nexpr is not in
    cover.nprimes and whose prime.pexpr is not in
    cover.pprimes do:
{
        /* combine evaluates to a new partial cover which */
        /* combines cover and prime, see definition */
        partial_cover = combine(cover, prime);
        num_nodes_cov = number of 1's in partial_cover.cov;
        /* first make sure that prime isn't */
        /* contained in cover */
```

```
if (num_nodes_cov == number of 1's in prime.cov)
     skip;  /* goto top of loop */
/* make sure that cover isn't */
/* contained in prime */
if (num_nodes_cov == number of 1's in prime.cov)
     skip;

/* get_tran_count evaluates to number of */
/* transistors needed to implement */
/* partial_cover.nfact and partial_cover.pfact, */
/* see definition */
trans_count = get_tran_count(partial_cover);
efficiency = num_nodes_cov / trans_count;

/* see if this search path can be bound */
if ( (trans_count > best_transistor_count) ||
     ((trans_count == best_transistor_count) &&
      (num_nodes_cov < num_nodes_to_cover))) skip;

/* see if we have a just-as-good complete cover */
if ( (trans_count == best_transistor_count) &&
     (num_nodes_cov == num_nodes_to_cover))
{ best_covers = best_covers list with partial_cover
                 appended to it;
/* a partial cover must also be better than */
/* the complete covers */
if ( efficiency > best_efficiency )
{ best_efficiency = efficiency;
   best_partial_covers = (); }
skip; }

/* see if we have a better complete cover */
if ( (trans_count < best_transistor_count) &&
     (num_nodes_cov == num_nodes_to_cov))
{ best_covers = ();  /* flush complete covers */
   best_covers = best_covers list with partial_cover
                 appended to it;
best_transistor_count = trans_count;
/* a partial cover must also be better than */
/* the complete covers */
if ( efficiency > best_efficiency )
   { best_efficiency = efficiency;
     best_partial_covers =(); }
skip;}

/* Otherwise, we have a partial cover with less */
/* transistors than the best complete cover to */
/* date, so we must see if it is among the best */
/* partial covers */
```

```
        /* see if just-as-good partial cover */
        if (efficiency == best_efficiency)
        { best_partial_covers = best_partial_covers list with
                        partial_cover appended to it;
        skip;}

/* see if we have a new best partial cover */
        if (efficiency > best_efficiency)
        { best_efficiency = efficiency;
          best_partial_covers = ();
          best_partial_covers = best_partial_covers list with
                        partial_cover appended to it;
          skip; }

}/* end loop */

/* recurse on all the equally promising partial covers */
For each partial in best_partial_covers do:
        greedy_select (partial);

} /* end greedy_select */ combine(cover, prime) evaluates to type COVER
        cover of type COVER;
        prime of type PRIME;
{
        /* declare local variables */
        new_cover of type COVER;
        constant_space_vec of type vector of 2ⁿ bits;
        polarity_vec of type vector of 2ⁿ integers;
        i of type integer;

new_cover.cov    =    bitwise  OR  of  cover.cov  with
prime.cov;
        if (the vectors new_cover.cov and cover.cov are the
                same)
            /* prime is contained in cover */
            return( new_cover );
        if (the vectors new_cover.cov and prime.cov are the
same)
            /* cover is contained in prime */
            return( new_cover );
        /* otherwise we know that prime adds to cover */
        new_cover.nprimes = cover.nprimes;
        new_cover.pprimes = cover.pprimes;
```

```
        /* now we must determine if prime adds to cover's */
        /* N network, P network, or both */
        if(prime only has an N pass expression)
              new_cover.nprimes = prime.nexpr appended to
                          cover.nprimes;
        else if(prime only has a P pass expression)
              new_cover.pprimes = prime.pexpr appended to
                          cover.pprimes;
        else
{
        /* see if prime covers both 0 and 1 nodes */
        /* in CONSTANT_SPACE */
        constant_space_vec = CONSTANT_SPACE encoded as vector;
        For i from 0 to (2ⁿ - 1) do:
            { if ( (cover.cov[i] == 0) && (prime.cov[i] -==1)
)
              if (constant_space_vec[i] == 0)
                  polarity_vec[i] = 0;
              else
                  polarity_vec[i] = 1;
              else
                  polarity_vec[i] = 2;
            }/* end For */
        if (polarity_vec contains a 0)
        new_cover.nprimes = prime.nexpr appended to
                    cover.nprimes;
        if (polarity_vec contains a 1)
        new_cover.pprimes = prime.pexpr appended to
                    cover.pprimes;
        }/* end else */ new_cover.nfact = minimization of new_cover.nprimes
                    using Transform1, Transform2 and boolean
                    minimization;
        new_cover.pfact = a minimization of new_cover.pprimes
                    using Transform1, Transform2 and boolean
                    minimization;

return( new_cover );
}/* end combine */
```

```
get_tran_count(cover) evaluates to type integer
    cover of type COVER;
{
    /* declare local variables */
    inv_steer_ctrls of type set;
    n_half_invs of type set;
    p_half_invs of type set;
    num_invs_steer, num_steer_lits of type integer;
    num_half_invs of type integer;

/* number of steering transistors */
    num_steer_lits = number of literals appearing in all
            the boolean expressions of both cover.nfact
            and cover.pfact;
    /* number of inverters needed to control steering */
    inv_steer_ctrls = { x | x' is a literal in a boolean
            expression in cover.nfact or cover.pfact,
            or both };
    num_invs_steer = size of inv_steer_ctrls;
    /* number of half-inverters for pass variables */
    n_half_invs = { x | x' is a pass variable in
            cover.nfact and x ∉ inv_steer_ctrls };
    p_half_invs = { x | x' is a pass variable in
            cover.pfact and x ∉ inv_steer_strls };
    num_half_invs = size of n_half_invs + size of
            p_half_invs;

return( num_steer_lits + (num_invs_steer * 2) +
            num_half_invs );
}
```

APPENDIX B

```
/* declare global variables */
best_transistor_count, num_nodes_to_cover of type integer;
best_covers of type list;
empty_cover of type COVER;

/* initialize variables */
best_transistor_count = ∞
best_covers = ();/* best_covers will contain all equally
          efficient */
             /* mixed gates to implement function */
num_nodes_to_cover = total number of input combinations to
             cover,
             which is $2^n$ for an n input function;
empty_cover.nprimes = ();
empty_cover.pprimes = ();
empty_cover.cov = a vector of $2^n$ zeros, except that each N
          node is set to 1;

/* call greedy cover selector */
greedy_select (empty_cover);
```

APPENDIX C

The inputPE is as follows:

```
(CD + AB):(X) +
(AEG):(Y) +
(FEG):(Q) +
(FEI):(W)
```

The subBE's are:

```
(CD + AB)
(AEG)
(FEG)
(FEI)
```

Notice that only (CD + AB) must be divided by Transform2 in order to produce a mergeable form because it has a top-level OR operator in its subBE and a single pass variable for its subPE. All the other subBE's have an AND top-level operator and thus already qualify for merging. Applying Tranform2 to (CD + AB):(X) yields the following inputPE:

```
(CD):(X) +
(AB):(X) +
(AEG):(Y) +
(FEG):(Q) +
(FEI):(W)
```

Assign a unique integer, starting at 1, to each subBE:

```
1 (CD)
2 (AB)
3 (AEG)
4 (FEG)
5 (FEI)
```

Create the mergeableExprs list:

```
C
D
A
B
E
G
F
I
```

For each expression in mergeableExprs create the set allTopLevel containing the unique number of each subBE in which the expression from mergeableExprs appears: (allTopLevel sets with more than one element are shown circled in Fig 14)

C {1}
    D {1}
    A {2, 3}
    B {2}
    E {3, 4, 5}
    G {3, 4}
    F {4, 5}
    I {5}

For each allTopLevel in mergeableExprs generate allTopLevels:

C {{1}}
    D {{1}}
    A {{2}, {3}, {2, 3}}
    B {{2}}
    E {{3}, {4}, {5}, {3, 4}, {4, 5}, {3, 5}, {3, 4, 5}}
    G {{3}, {4}, {3, 4}}
    F {{4}, {5}, {4, 5}}
    I {{5}}

Eliminate subsets with only one element:

A {{2, 3}}
    E {{3, 4}, {4, 5}, {3, 5}, {3, 4, 5}}
    G {{3, 4}}
    F {{4, 5}}

Create allMerges by pairing each expression from mergeableExprs with all of its subsets in its allTopLevels set:

{ {A, {2, 3}}, {E, {3, 4, 5}}, {E, {3, 4}}, {E, {4, 5}}, {E, {3, 5}}, {G, {3, 4}}, {F, {4, 5}} }

APPENDIX D

An example of a concurrMergeSet because the second elements of the mergeSet's are disjoint:

{ {A, {2, 3}}, {E, {4, 5}} }

An example of a concurrMergeSet because the second elements of the mergeSet's are identical:

{ {E, {3, 4}}, {G, {3, 4}} }

An example of a concurrMergeSet because the second elements of the mergeSet's are a subset or a superset depending on the order of comparison:

{ {E, {3, 4, 5}}, {G, {3, 4}} }

An example of a non-concurrMergeSet because the second elements of the mergeSet's are not DISS:

{ {A, {2, 3}}, {E, {3, 4, 5}} }

APPENDIX E

```
/* declare, and initialize, global variables */ maxMergeSets = Initially empty, this will be a set of all
     the maxMergeSet's for the inputPE;

allMerges = The set of all the possible mergeSet's that
     could be performed on the inputPE;

emptySet = an empty set used just to start off
     findMaxMergeSets;

/* findMaxMergeSets, the algorithm for finding all the
     maxMergeSet's, is called.  When findMaxMergeSets
     returns, the global variable maxMergeSets will contain
     a set of all the maxMergeSet's for the inputPE. */
findMaxMergeSets(emptySet, allMerges);

/* findMaxMergeSets has the following definition */
findMaxMergeSets(dissMerges, wrtTheseMerges)
     dissMerges of type set;
     wrtTheseMerges of type set;
{
     For each merge in wrtTheseMerges do:
     {
          mergesDissWrtMerge = result of comparing merge
               with all the other mergeSet's, which do not
               have the same first element, in
               wrtTheseMerges and returning a set of those
               mergeSet's which are DISS with respect to
               merge;
          /* First determine whether mergesDissWrtMerge has
               more than one mergeSet in it. */
          if ( sizeOf( mergesDissWrtMerge ) <= 1)
          {
               /* no need to search mergesDissWrtMerge */
               maxMergeSets = maxMergeSets with the
                    following element, provided it is not
                    already in maxMergeSets, added to it:
                    union(dissMerges, merge,
                    mergesDissWrtMerge);
          }
          /* continue to search for more maxMergeSet's */
          else
                    findMaxMergeSets(union(dissMerges, merge),
                         mergesDissWrtMerge);
     ) /* end For */
} /* end findMaxMergeSets */
```

APPENDIX F

The following is a simulation of findMaxMergeSets upon the allMerges of Appendix A:

```
findMaxMergeSets(
                dissMerges = {},
                wrtTheseMerges =
                  { {A, {2, 3}}, {E, {3, 4, 5}},
                    {E, {3, 4}}, {E, {4, 5}}, {E, {3,
                 5}},
                    {G, {3, 4}}, {F, {4, 5}} }
             )

merge = {A, {2, 3}}
    mergesDissWrtMerge = { {E, {4, 5}}, {F, {4, 5}} } findMaxMergeSets(
                dissMerges = { {A, {2, 3}} },
                wrtTheseMerges =
                  { {E, {4, 5}}, {F, {4, 5}} }
             )

merge = {E, {4, 5}}
    mergesDissWrtMerge = { {F, {4, 5}} } maxMergeSets = {
                      { {A, {2, 3}}, {E, {4, 5}},
                        {F, {4, 5}} }
                   } merge = {F, {4, 5}}
    mergesDissWrtMerge = { {E, {4, 5}} } findMaxMergeSets(
                dissMerges = {},
                wrtTheseMerges =
                  { {A, {2, 3}}, {E, {3, 4, 5}},
                    {E, {3, 4}}, {E, {4, 5}}, {E, {3,
                 5}},
                    {G, {3, 4}}, {F, {4, 5}} }
             )

merge = {E, {3, 4, 5}}
    mergesDissWrtMerge = { {G, {3, 4}}, {F, {4, 5}} }
```

```
findMaxMergeSets(
                dissMerges = { {E, {3, 4, 5}} },
                wrtTheseMerges =
                    { {G, {3, 4}}, {F, {4, 5}} }
            )

merge = {G, {3, 4}}
    mergesDissWrtMerge = {} maxMergeSets = {
                    { {A, {2, 3}}, {E, {4, 5}},
                      {F, {4, 5}} },
                    { {E, {3, 4, 5}}, {G, {3, 4}} }
                } merge = {F, {4, 5}}
    mergesDissWrtMerge = {} maxMergeSets = {
                    { {A, {2, 3}}, {E, {4, 5}},
                      {F, {4, 5}} },
                    { {E, {3, 4, 5}}, {G, {3, 4}} },
                    { {E, {3, 4, 5}}, {F, {4, 5}} }
                } findMaxMergeSets(
                dissMerges = {},
                wrtTheseMerges =
                    { {A, {2, 3}}, {E, {3, 4, 5}},
                      {E, {3, 4}}, {E, {4, 5}}, {E, {3, 5}},
                      {G, {3, 4}}, {F, {4, 5}} }
            )

merge = {E, {3, 4}}
    mergesDissWrtMerge = { {G, {3, 4}} } maxMergeSets = {
                    { {A, {2, 3}}, {E, {4, 5}},
                      {F, {4, 5}} },
                    { {E, {3, 4, 5}}, {G, {3, 4}} },
                    { {E, {3, 4, 5}}, {F, {4, 5}} },
                    { {E, {3, 4}}, {G, {3, 4}} }
                } merge = {E, {4, 5}}
    mergesDissWrtMerge = { {A, {2, 3}}, {F, {4, 5}} }
```

```
findMaxMergeSets(
                dissMerges = { {E, {4, 5}} },
                wrtTheseMerges =
                  { {A, {2, 3}}, {F, {4, 5}} }
            )

merge = {A, {2, 3}}
    mergesDissWrtMerge = { {F, {4, 5}} } merge = {F, {4, 5}}
    mergesDissWrtMerge = { {A, {2, 3}} } findMaxMergeSets(
                dissMerges = {},
                wrtTheseMerges =
                  { {A, {2, 3}}, {E, {3, 4, 5}},
                    {E, {3, 4}}, {E, {4, 5}}, {E, {3, 5}},
                    {G, {3, 4}}, {F, {4, 5}} }
            )

merge = {E, {3, 5}}
    mergesDissWrtMerge = {} maxMergeSets = {
                    { {A, {2, 3}}, {E, {4, 5}},
                        {F, {4, 5}} },
                    { {E, {3, 4, 5}}, {G, {3, 4}} },
                    { {E, {3, 4, 5}}, {F, {4, 5}} },
                    { {E, {3, 4}}, {G, {3, 4}} },
                    { {E, {3, 5}} }
                   } merge = {G, {3, 4}}
    mergesDissWrtMerge = { {E, {3, 4, 5}}, {E, {3, 4}}} findMaxMergeSets(
                dissMerges = { {G, {3, 4}} },
                wrtTheseMerges =
                  { {E, {3, 4, 5}}, {E, {3, 4}} }
            )

merge = {E, {3, 4, 5}}
    mergesDissWrtMerge = {} merge = {E, {3, 4}}
    mergesDissWrtMerge = {}
```

```
findMaxMergeSets(
            dissMerges = {},
            wrtTheseMerges =
               { {A, {2, 3}}, {E, {3, 4, 5}},
                  {E, {3, 4}}, {E, {4, 5}}, {E, {3,
             5}},
                  {G, {3, 4}}, {F, {4, 5}} }
        )

merge = {F, {4, 5}}
    mergesDissWrtMerge = { {A, {2, 3}}, {E, {3, 4, 5}},
                            {E, {4, 5}} } findMaxMergeSets(
            dissMerges = { {F, {4, 5}} },
            wrtTheseMerges =
                { {A, {2, 3}}, {E, {3, 4, 5}},
                    {E, {4, 5}} }
        )

merge = {A, {2, 3}}
    mergesDissWrtMerge = { {E, {4, 5}} } merge = {E, {3, 4, 5}}
    mergesDissWrtMerge = {} merge = {E, {4, 5}}
    mergesDissWrtMerge = { {A, {2, 3}} }
```

The result of the above simulation of findMaxMergeSets is the following set of all the maxMergeSets:

```
maxMergeSets = {
                { {A, {2, 3}}, {E, {4, 5}},
                    {F, {4, 5}} },
                { {E, {3, 4, 5}}, {G, {3, 4}} },
                { {E, {3, 4, 5}}, {F, {4, 5}} },
                { {E, {3, 4}}, {G, {3, 4}} },
                { {E, {3, 5}} }
            }
```

What is claimed is:

1. In a data processing system having at least one processor and a memory, a method of producing a schematic description of an integrated circuit comprised of pass and restoring logic networks that performs a specified function, comprising the processor performing the steps of:
   a) storing in memory a representation of the function in a set of data structures;
   b) finding prime implicants of the representation held in the data structures;
   c) selecting prime implicants to be used in generating the integrated circuit layout by;
      1) determining which prime implicant when added to already selected prime implicants create a most efficient partial cover where initially the partial cover is empty;
      2) adding the most efficient prime implicant to the already selected prime implicant, to generate a new partial cover;
      3) repeating these steps until the partial cover covers the function; and
   d) generating a schematic description of an integrated circuit layout from the selected prime implicants.

2. A method as recited by in claim 1 wherein the data structures are comprised of nodes having values.

3. A method as recited in claim 2 wherein the step of determining which prime implicant when added to the partial cover is most efficient comprises for each remaining prime implicant, dividing a number of nodes covered by the partial cover when the remaining prime implicant is added to the partial cover by a number of transistors required to implement the partial cover when the remaining prime implicant is added to the partial cover.

4. A method as recited in claim 3 wherein if multiple prime implicants result in equally efficient new partial covers when added to the partial cover, the steps performed to determine which prime implicant is most efficient when added to the partial cover are performed recursively for each of the new partial covers until a truly most efficient new partial cover is found.

5. A method as recited in claim 3 wherein the step of determining the number of transistors in a partial cover comprises a data processing method for an input pass expression comprising:
   a) canonicalizing the input pass expression into a form comprising:
      1) a set of sub-pass expressions which are ORed together;
      2) every sub-pass expression driven by the same pass variable;
   b) generating a boolean expression, called replaceBE, consisting of the OR of the boolean expression in every sub-pass expression;
   c) replacing the sub-pass expressions with a single pass expression whose boolean expression is replaceBE and whose pass variable is same pass variable as that for every sub-pass expression.

6. A method as recited in claim 5 wherein the step of determining the number of transistors in a partial cover comprises a data processing method for an input pass expression comprising:
   a) the definition of a top-level AND operator which is an AND operator whose output is the output of a boolean expression;
   b) canonicalizing the input pass expression into a form comprising:
      1) two or more sub-pass expressions which are ORed together;
      2) each of these sub-pass expressions is comprised of two main sections: a boolean equation which shall be called subBE, and a pass expression which shall be called subPE;
      3) every sub-pass expression must have either a top-level AND operator in its subBE or the sub-pass expression must have a subPE which is more complex than just a single pass variable;
   c) causing the operands of the top-level AND operators in the subBE's, which are functionally identical, to be shared.

7. A method as recited in claim 5 wherein the step of determining the number of transistors in a partial cover comprises a data processing method for an input pass expression comprising:
   a) the definition of a top-level AND operator which is an AND operator whose output is the output of a boolean expression;
   b) canonicalizing the input pass expression into a form comprising:
      1) two or more sub-pass expressions which are ORed together;
      2) each of these sub-pass expressions is comprised of two main sections: a boolean equation which shall be called subBE, and a pass expression which shall be called subPE;
      3) every sub-pass expression must have either a top-level AND operator in its subBE or the sub-pass expression must have a subPE which is more complex than just a single pass variable;
   c) causing entire subBE's which are functionally identical, and where each of the entire subBE's have subPE's that are more complex than a single pass variable, to be shared.

8. A method as recited in claim 5 wherein the step of determining the number of transistors in a partial cover comprises a data processing method for an input pass expression comprising:
   a) the definition of a top-level AND operator which is an AND operator whose output is the output of a boolean expression;
   b) canonicalizing the input pass expression into a form comprising:
      1) two or more sub-pass expressions which are ORed together;
      2) each of these sub-pass expressions is comprised of two main sections: a boolean equation which shall be called subBE, and a pass expression which shall be called subPE;
      3) every sub-pass expression must have either a top-level AND operator in its subBE or the sub-pass expression must have a subPE which is more complex than just a single pass variable;
   c) causing functionally identical operands of top-level AND operators in the subBE's to be shared with functionally identical entire subBE's where each of the entire subBE's have subPE's that are more complex than a single pass variable.

9. A method as recited in claim 5 wherein the step of determining the number of transistors in a partial cover comprises a data processing method for an input pass expression comprising boolean minimization upon the boolean expressions of the input pass expression.

10. A method as recited in claim 9 wherein the step of determining the number of transistors in a partial cover comprises a data processing method for an input pass expression comprising:
  a) the definition of a top-level AND operator which is an AND operator whose output is the output of a boolean expression;
  b) canonicalizing the input pass expression into a form comprising:
    1) two or more sub-pass expressions which are ORed together;
    2) each of these sub-pass expressions is comprised of two main sections: a boolean equation which shall be called subBE, and a pass expression which shall be called subPE;
    3) every sub-pass expression must have either a top-level AND operator in its subBE or the sub-pass expression must have a subPE which is more complex than just a single pass variable;
  c) causing the operands of the top-level AND operators in the subBE's, which are functionally identical, to be shared.

11. A method as recited in claim 9 wherein the step of determining the number of transistors in a partial cover comprises a data processing method for an input pass expression comprising:
  a) the definition of a top-level AND operator which is an AND operator whose output is the output of a boolean expression;
  b) canonicalizing the input pass expression into a form comprising:
    1) two or more sub-pass expressions which are ORed together;
    2) each of these sub-pass expressions is comprised of two main sections: a boolean equation which shall be called subBE, and a pass expression which shall be called subPE;
    3) every sub-pass expression must have either a top-level AND operator in its subBE or the sub-pass expression must have a subPE which is more complex than just a single pass variable;
  c) causing entire subBE's which are functionally identical, and where each of the entire subBE's have subPE's that are more complex than a single pass variable, to be shared.

12. A method as recited in claim 9 wherein the step of determining the number of transistors in a partial cover comprises a data processing method for an input pass expression comprising:
  a) the definition of a top-level AND operator which is an AND operator whose output is the output of a boolean expression;
  b) canonicalizing the input pass expression into a form comprising:
    1) two or more sub-pass expressions which are ORed together;
    2) each of these sub-pass expressions is comprised of two main sections: a boolean equation which shall be called subBE, and a pass expression which shall be called subPE;
    3) every sub-pass expression must have either a top-level AND operator in its subBE or the sub-pass expression must have a subPE which is more complex than just a single pass variable;
  c) causing functionally identical operands of top-level AND operators in the subBE's to be shared with functionally identical entire subBE's where each of the entire subBE's have subPE's that are more complex than a single pass variable.

13. A method as recited in claim 3 wherein the step of determining the number of transistors in a partial cover comprises a data processing method for an input pass expression comprising:
  a) the definition of a top-level AND operator which is an AND operator whose output is the output of a boolean expression;
  b) canonicalizing the input pass expression into a form comprising:
    1) two or more sub-pass expressions which are ORed together;
    2) each of these sub-pass expressions is comprised of two main sections: a boolean equation which shall be called subBE, and a pass expression which shall be called subPE;
    3) every sub-pass expression must have either a top-level AND operator in its subBE or the sub-pass expression must have a subPE which is more complex than just a single pass variable;
  c) causing the operands of the top-level AND operators in the subBE's, which are functionally identical, to be shared.

14. A method as recited in claim 3 wherein the step of determining the number of transistors in a partial cover comprises a data processing method for an input pass expression comprising:
  a) the definition of a top-level AND operator which is an AND operator whose output is the output of a boolean expression;
  b) canonicalizing the input pass expression into a form comprising:
    1) two or more sub-pass expressions which are ORed together;
    2) each of these sub-pass expressions is comprised of two main sections: a boolean equation which shall be called subBE, and a pass expression which shall be called subPE;
    3) every sub-pass expression must have either a top-level AND operator in its subBE or the sub-pass expression must have a subPE which is more complex than just a single pass variable;
  c) causing entire subBE's which are functionally identical, and where each of the entire subBE's have subPE's that are more complex than a single pass variable, to be shared.

15. A method as recited in claim 3 wherein the step of determining the number of transistors in a partial cover comprises a data processing method for an input pass expression comprising:
  a) the definition of a top-level AND operator which is an AND operator whose output is the output of a boolean expression;
  b) canonicalizing the input pass expression into a form comprising:
    1) two or more sub-pass expressions which are ORed together;
    2) each of these sub-pass expressions is comprised of two main sections: a boolean equation which shall be called subBE, and a pass expression which shall be called subPE;
    3) every sub-pass expression must have either a top-level AND operator in its subBE or the sub-pass expression must have a subPE which is more complex than just a single pass variable;
  c) causing functionally identical operands of top-level AND operators in the subBE's to be shared with functionally identical entire subBE's where each of the entire subBE's have subPE's that are more complex than a single pass variable.

16. A method as recited in claim 3 wherein the step of determining the number of transistors in a partial cover comprises a data processing method for an input pass expression comprising:
   a) the definition of a top-level OR operator which is an OR operator whose output is the output of the boolean expression and the definition of an ORexpr which is an operand of said top-level OR operator;
   b) canonicalizing the input pass expression into a form comprising a single pass expression whose boolean expression has a top-level OR operator;
   c) replacing the input pass expression with a set of sub-pass expressions which are ORed together where each sub-pass expression has a boolean expression which is an ORexpr of the input pass expression's boolean expression and where every sub-pass expression has a pass expression which is the same as the pass expression of the input pass expression.

17. In a data processing system having at least one processor and a memory, a method for generating a schematic description of an integrated circuit comprising the processor performing the steps of:
   a) accepting inputs and corresponding outputs for a function to be performed by the integrated circuit;
   b) generating, and storing in memory, data structures comprised of multidimensional spaces having a plurality of vertices for representing the inputs and the outputs and storing a representation of the inputs and the outputs in the data structures, said data structures including data structures that view the inputs as pass values and a data structure that views the inputs as only control variables;
   c) finding implicants of the representation held in data structures and using implicants of the representations held in the data structures that view the inputs as pass variables to represent pass logic networks, and using implicants from the data structures that view the inputs only as control variables to represent restoring logic networks;
   d) selecting certain of the pass and restoring logic implicants using an optimization procedure to generate a cover of the function, the optimization procedure determining an efficiency number of a selection of implicants by determining a number of vertices covered by the selection of implicants and dividing the number of vertices covered by a number of transistors required to implement the selection of implicants; and
   e) producing the schematic description of the integrated circuit by generating logic networks for the cover.

18. In a data processing system having at least one processor and a memory, a method of generating a schematic description of an integrated circuit structure having both pass logic networks and restoring logic networks, comprising the processor performing the steps of:
   a) accepting as input to the data processing system, a functional description of the integrated circuit structure that specifies function outputs that may assume either a value of one or a value of zero;
   b) storing in memory at least one representation of the function derived from the functional description in a set of data structures, said at least one representation relating inputs of the function to outputs and a separate representation of the function being stored for all possible combinations of values that may be assumed by the function outputs that may assume either a value of one or a value of zero;
   c) finding a set of prime implicants of each representation held in the data structures;
   d) selecting a cover or covers of the function, using an optimization procedure, from the set of prime implicants for each representation;
   e) selecting the best cover or covers of the function; and
   f) generating as output the schematic description of the integrated circuit structure of the selected cover or covers.

19. In a data processing system having at least one processor and a memory, a method of generating a schematic description of an integrated circuit structure having both pass logic networks and restoring logic networks, comprising the processor performing the steps of:
   a) accepting a functional description of the integrated circuit structure as input to the data processing system;
   b) storing in memory a representation of the function derived from the functional description in a set of data structures, said representation relating inputs of the function to outputs and flagging combinations of inputs that will never be applied to the integrated circuit structure;
   c) finding prime implicants of the representation held in the data structures wherein outputs for the flagged combinations of inputs are considered as both ones or zeroes when finding prime implicants;
   d) selecting a set of prime implicants that in aggregate cover at least all combinations of inputs of the function other than the flagged inputs;
   e) generating as output the schematic description of the integrated circuit structure from the selected set of prime implicants.

20. A method as recited in claim 19 wherein different selected prime implicants may not set an output of a flagged combination of inputs to different values.

21. In a data processing system having at least one processor and a memory, a method for generating a schematic description of an integrated circuit, comprising the processor performing the steps of:
   a) accepting inputs and corresponding outputs for a function to be performed by the integrated circuit;
   b) generating, and storing in memory, data structures comprised of multidimensional spaces for representing the inputs and the outputs and storing a representation of the inputs and the outputs in the data structures, said data structures including data structures that view the inputs as pass values and a data structure that views the inputs as only control variables;
   c) finding implicants of the representation held in data structures and using implicants of the representations held in the data structures that view the inputs as pass variables to represent pass logic networks, and using implicants from the data structures that view the inputs only as control variables to represent restoring logic networks;
   d) selecting certain of the pass and restoring logic implicants using a greedy heuristic optimization procedure to generate a cover of the function; and
   e) producing the schematic description of the integrated circuit by generating logic networks for the cover.

22. In a data processing system having at least one processor and a memory, a method for generating a schematic description of an integrated circuit, comprising the processor performing the steps of:

a) accepting inputs and corresponding outputs for a function to be performed by the integrated circuit;

b) generating, and storing in memory, data structures for representing the inputs and the outputs and storing a plurality of representations of the inputs and the outputs in the data structures, the data structures including at least one data structure that views the inputs as pass values;

c) using the representations held in the data structures that view the inputs as pass variables to represent pass logic networks;

d) selecting certain of the representations using an optimization procedure, wherein the optimization procedure applies a transform to a logic network, wherein the logic network comprises a plurality of logic networks represented by a selection of certain of the representations, and application of the transform introduces at least one wired OR node below the logic network's root node; and e) producing the schematic description of the integrated circuit by generating logic networks for the selected representations.

23. A data processing method as recited in claim 22 wherein application of the transform to the logic network comprises the following steps:

a) selecting a portion of the logic network which has a root node driven by an OR operator, wherein the OR operator has a plurality of inputs with each input driven by a sub-pass expression;

b) for each sub-pass expression, identifying its boolean expression and pass expression;

c) for each sub-pass expression, determining whether a first condition is satisfied wherein the first condition requires the boolean expression of each sub-pass expression have a root node driven by an AND operator;

d) for each sub-pass expression, determining whether a second condition is satisfied wherein the second condition requires the pass expression of each sub-pass expression be more complex than a single pass variable;

e) assigning a unique identifier to each boolean expression of each sub-pass expression which satisfies the first condition;

f) assigning a unique identifier to each boolean expression of each sub-pass expression which does not satisfy the first condition but does satisfy the second condition;

g) creating an initially empty first list to contain items;

h) for each sub-pass expression satisfying the first condition:
   1) create a second list whose items comprise all the operands of the root node AND operator of the sub-pass expression's boolean expression;
   2) for each item of the second list, add the item to the first list if the second list item is not functionally identical to an item already on the first list;

i) for each sub-pass expression which does not satisfy the first condition and does satisfy the second condition, add the boolean expression of the sub-pass expression as an item of the first list provided that the boolean expression is not functionally identical to an item already on the first list;

j) for each first item on the first list, replace the first item with a second item which is a third list comprising a third item and a fourth item, the third item being the first item and the fourth item being a set comprising the unique identifier of each sub-pass expression's boolean expression which is either functionally identical to the first item or which comprises a root node AND operand which is functionally identical to the first item; and k) for each item on the first list replace its set of unique identifiers with a set of subsets of its set of unique identifiers.

24. A data processing method as recited in claim 22 wherein application of the transform to the logic network comprises the following steps:

a) selecting a portion of the logic network which has a root node driven by an OR operator, wherein the OR operator has a plurality of inputs with each input driven by a sub-pass expression;

b) for each sub-pass expression, identifying its boolean expression and pass expression;

c) for each sub-pass expression, determining whether a first condition is satisfied wherein the first condition requires the boolean expression of each sub-pass expression have a root node driven by an AND operator;

d) assigning a unique identifier to each boolean expression of each sub-pass expression which satisfies the first condition;

e) creating an initially empty first list to contain items;

f) for each sub-pass expression satisfying the first condition:
   1) create a second list whose items comprise all the operands of the root node AND operator of the sub-pass expression's boolean expression;
   2) for each item of the second list, add the item to the first list if the second list item is not functionally identical to an item already on the first list;

g) for each first item on the first list, replace the first item with a second item which is a third list comprising a third item and a fourth item, the third item being the first item and the fourth item being a set comprising the unique identifier of each sub-pass expression's boolean expression which comprises a root node AND operand which is functionally identical to the first item; and h) for each item on the first list replace its set of unique identifiers with a set of subsets of its set of unique identifiers.

25. A data processing method as recited in claim 24 wherein a first type of list, representing a single application of the transform, is formed by pairing a fifth item and a sixth item, with both the fifth item and the sixth item being taken from a single seventh item of the first list, with the fifth item being a third item of the seventh item and the sixth item being a subset, with a plurality of elements, from a fourth item of the seventh item.

26. A data processing method as recited in claim 25 wherein:

a) a fourth list, initially empty, is created; and b) a plurality of lists of the first type are created with each first type list being added to the fourth list if the sixth item of the first type list to be added is, with respect to the sixth item of every first type list already on the fourth list, disjoint, or identical or a subset or a superset.

* * * * *